US012663896B1

(12) United States Patent
Son

(10) Patent No.: US 12,663,896 B1
(45) Date of Patent: Jun. 23, 2026

(54) SENSOR CIRCUITS FOR NARROW BEZELS AROUND ELECTRONIC DISPLAYS

(71) Applicant: Amazon Technologies, Inc., Seattle, WA (US)

(72) Inventor: Kyu Tak Son, Dublin, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 19/091,473

(22) Filed: Mar. 26, 2025

Related U.S. Application Data

(60) Provisional application No. 63/678,865, filed on Aug. 2, 2024.

(51) Int. Cl.
G06F 3/041 (2006.01)
G06F 3/046 (2006.01)
H05K 5/00 (2006.01)
(52) U.S. Cl.
CPC .......... G06F 3/04164 (2019.05); G06F 3/046 (2013.01); H05K 5/0018 (2022.08); G06F 2203/04107 (2013.01)
(58) Field of Classification Search
CPC .......... G02F 1/13338; G02F 1/134336; G02F 1/134372; G02F 1/13439; G02F 1/13454;

G02F 1/136204; G06F 2203/04103; G06F 2203/04107; G06F 2203/04108; G06F 2203/04112; G06F 3/0412; G06F 3/04164; G06F 3/0443; G06F 3/0445; G06F 3/0446
See application file for complete search history.

(56) References Cited

U.S. PATENT DOCUMENTS

2018/0059864 A1* 3/2018 Pham .................... G06F 3/0412
2018/0088717 A1* 3/2018 Chen .................... G06F 3/0446

* cited by examiner

*Primary Examiner* — Insa Sadio
(74) *Attorney, Agent, or Firm* — K&L Gates LLP

(57) ABSTRACT

Systems and methods are described for configuring sensor circuits in electronic devices. An example sensor circuit may comprise a sensor comprising at least one of an electromagnetic resonance layer, a touch panel layer, a receiver, or a transmitter. The example may comprise a transmitter wire coupled to the sensor. The transmitter wire may be formed to include, at least in part, a first bent portion. The example may comprise a receiver wire coupled to the sensor. The receiver wire may be formed to include, at least in part, a second bent portion. The first bent portion and the second bent portion may be disposed, at least in part, in a bending area adjacent an edge of the sensor. The example may comprise a sensor tail formed to include, at least in part, the transmitter wire and the receiver wire. The sensor tail may be coupled to a control circuit.

20 Claims, 7 Drawing Sheets

Electronic Device 600

Processor(s) 602

Memory 604

Network Interface(s) 606

Graphics Circuit 608

Graphics Processing Unit(s) (GPU(s)) 610

SENSOR CIRCUITS FOR NARROW BEZELS AROUND ELECTRONIC DISPLAYS

CROSS-REFERENCE TO RELATED APPLICATIONS

This non-provisional application claims the benefit of U.S. Provisional Application No. 63/678,865, filed Aug. 2, 2024, the entirety of which is incorporated herein by reference.

BACKGROUND

Electronic devices may have a variety of input modalities including touch screen display inputs, keyboard input, mouse input, stylus input, voice input, etc. For touch screen inputs, capacitive display components are often included to provide sensitivity to touch and/or stylus inputs.

DETAILED DESCRIPTION

In the following description, reference is made to the accompanying drawings which illustrate several examples for the present disclosure. It is understood that other embodiments may be utilized, and that mechanical, compositional, structural, electrical operational changes may be made without departing from the spirit and scope of the present disclosure. The following detailed description is not to be taken in a limiting sense, and the scope of the embodiments of the present invention is defined only by the claims of the issued patent.

An Electro-Magnetic Resonance (EMR) stylus may be a pen-shaped (or other-shaped) tool that can be used to interact with touch screen displays, such as those included in smartphones, tablets, wearable computing devices, etc. Generally, styluses can be slimmer and/or more precise than fingertips and, as a result, can provide more accurate control inputs. Active styluses include internal electronic components such as memory, processing components, sensors, etc. Passive styluses do not include internal electronic components and are detected using capacitive displays that detect electrical current and/or resistive displays that include pressure detection. Active styluses may offer increased functionality such as software-based pressure detection, tilt, and rotation detection, programmable functionality, hover functions, etc. However, active styluses typically require software support, charging, and may have differing software standards and/or support for different devices.

EMR styluses may offer many of the benefits and/or increased functionalities of active styluses but may be powered by a digitizer of the electronic display, thereby not requiring internal batteries or other power sources. However, electronic displays that support EMR styluses employ a dedicated EMR sensor layer (e.g., including the digitizer) and can therefore add weight, thickness, and cost to the electronic device.

Figure 7:
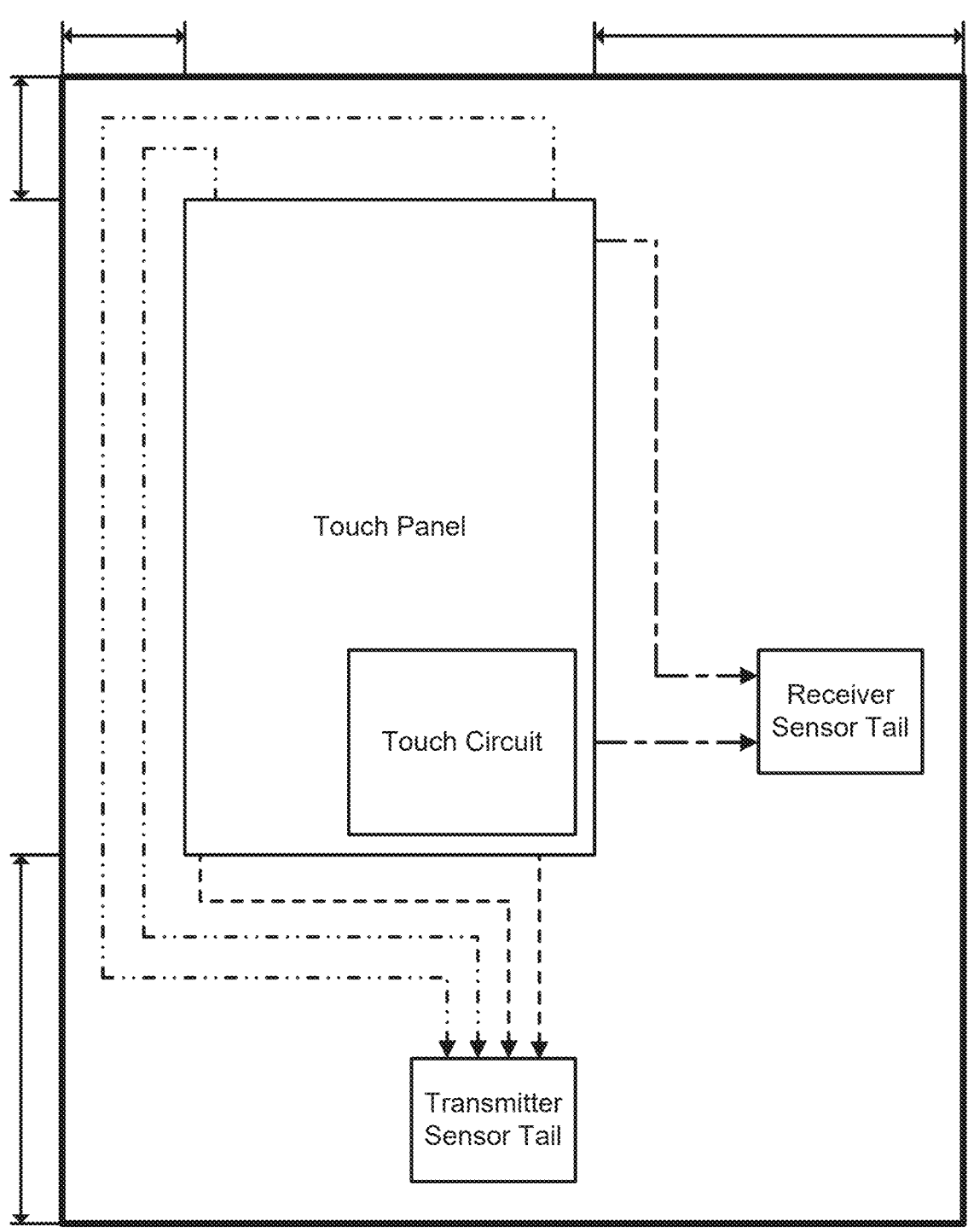
FIG. 7 illustrates a traditional touch panel circuit, in accordance with various aspects of the present disclosure.

It may be possible to avoid a separate EMR layer and to combine the function of the EMR layer in (or with) an existing touch sensitive (or touch panel) layer of a device display, thereby reducing weight and thickness of the device display. However, such a display may employ traditional touch panel circuits (such as illustrated in FIG. 7) which require a wider bezel to account for traditional transmitter and receiver wire routing that utilizes separate sensor tails. For example, as shown in FIG. 7, the wires of the traditional touch panel circuit are routed around all sides of the touch panel. In addition, the transmitter wires are fed to a transmitter sensor tail and the receiver wires are fed to a receiver sensor tail. It should be appreciated that the transmitter sensor tail is separate and distinct from the receiver sensor tail in traditional touch panel circuits such as shown in FIG. 7.

In contrast to the traditional systems and techniques described above, improved systems and techniques for reducing a bezel width in electronic devices are described herein. The present disclosure sets forth systems, methods, and apparatuses that, among other things, provide improved sensor circuits that allow for reduced bezel width. There are many advantages of these, and other examples described herein over traditional systems and/or circuits, such as those traditional systems and/or circuits described above.

One advantage is that systems and techniques described herein present sensor circuit configurations that can allow for a reduced bezel width (e.g., including a more than 50% reduction, or another percentage reduction, in width relative to conventional approaches, such as shown in FIG. 7) by re-routing sensor wires (e.g., transmitter wires, receiver wires, etc.) and/or wiring groups to wire bending (or folding) area(s) where the traces (and/or sensor tail(s)) are closest (or nearest) to an active sensor area (and/or control circuit) as described herein. Additionally, or alternatively, the systems and techniques described herein present sensor circuits that can allow for a reduced bezel width by feeding transmitter wires and receiver wires into a single sensor tail (e.g., instead of separate and distinct transmitter and receiver sensor tails, such as shown in FIG. 7). In some examples, the single sensor tail may be located (or disposed) closest (or nearest) to an active sensor area (and/or control circuit) as described herein. It should be appreciated that electronic devices that include the sensors circuits as described herein may reap the benefits of an EMR stylus writing experience along with touch panel layer input functionality, all with a thinner, lighter, and sleeker design with a narrow bezel (or border) around the display.

Moreover, it should be appreciated that such examples as set forth herein solve particular technical problems, such as those identified and described above for traditional touch panel circuits (e.g., of electronic devices, such as e-reader, tablet, smartphone, etc.) systems and techniques. It will be appreciated that the scope of the present disclosure encompasses many potential example embodiments in addition to those described above, some of which will be described in further detail below.

Now that some advantages associated with various systems and techniques described herein have been described above in contrast with traditional systems and techniques, an example sensor circuit will now be described below with reference to FIG. 1.

Figure 1:
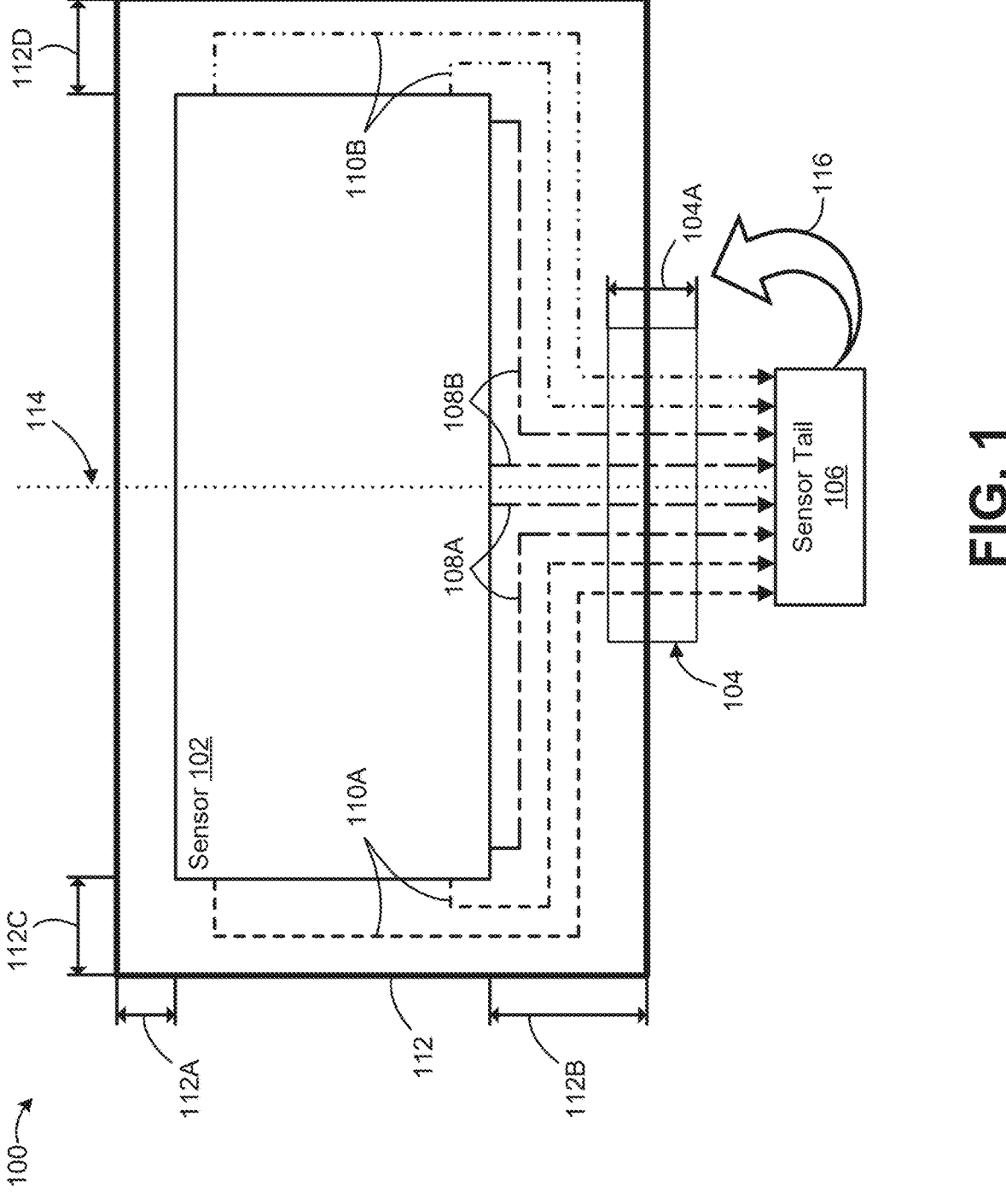
FIG. 1 illustrates an example sensor circuit, in accordance with various aspects of the present disclosure.

FIG. 1 illustrates an example sensor circuit, in accordance with various aspects of the present disclosure. As shown, the sensor circuit 100 may comprise a sensor 102, a bending area 104, a sensor tail 106, a plurality of receiver wires (e.g., wire(s) 108A, wire(s) 108B, and/or the like), and a plurality of transmitter wires (e.g., wire(s) 110A, wire(s) 110B, and/or the like). As shown, the sensor circuit 100 may be configured to fit, at least in part, within a space 112. It will be understood that the space 112 may represent (or comprise) one or more dimensions of (e.g., a space or cavity, at least in part, formed in and/or defined by) a housing (e.g., housing 514 as described below in connection with FIG. 5) of an electronic device. In some examples, an electronic device (e.g., electronic device 500 described below in connection with FIG. 5, electronic device 600 described below in connection with FIG. 6, and/or the like) may comprise, at least in part, the sensor circuit 100.

The sensor 102, as shown, may be any sensor (or a combination of any sensors) as described herein. As shown, the sensor 102 may comprise one or more of an Electro-Magnetic Resonance (EMR) panel (and/or technology), a sensor grid (e.g., a wire grid, or the like, such as laid out in an alternating vertical and horizontal pattern), an electro-magnetic coil, a touch panel, a capacitive touch sensor, a resistive touch sensor, a pressure sensor, a light sensor (e.g., photodiodes, phototransistors, or the like), and/or any other electronic devices (or combinations of electronic devices) as described herein for detecting the presence of one or more physical phenomena (e.g., electromagnetism, pressure, light, sound, etc.). In some examples, the sensor 102 may be an EMR panel layer and/or a touch panel layer disposed within a display stack (e.g., of a screen of an electronic device) configured to detect a location and/or a direction of movement of a stylus and/or a user's finger (e.g., along the screen of an electronic device. In some examples, the sensor 102 may be configured to transmit, or send, (e.g., to the control circuit 516 and/or the like as described herein) electrical signals (or commands) utilizing, at least in part, one or more wires of the plurality of transmitter wires and/or the sensor tail 106. In some examples, the sensor 102 may be config-ured to receive (e.g., from the control circuit 516 and/or the like as described herein) electrical signals (or commands) utilizing, at least in part, one or more wires of the plurality of receiver wires and/or the sensor tail 106.

The bending area 104, as shown, may include any bent portion(s) of one or more wires (or cable ribbons) as described herein. As shown, the bending area 104 may comprise, at least in part, one or more bent portions of the plurality of receiver wires (e.g., wire(s) 108A, wire(s) 108B, and/or the like), one or more bent portions of the plurality of transmitter wires (e.g., wire(s) 110A, wire(s) 110B, and/or the like), a bent wire, a curved wire, a folded wire, and/or any other wire(s) (or portion(s) of wire(s)) formed into a non-linear shape (or the like) as described herein. For example, a transmitter wire may form (or define) a first bent portion of the bending area 104 and a receiver wire may form (or define) a second bent portion of the bending area 104. In some examples, one or more bent portion(s) of wire may comprise at least one of a 180-degree summation bend, a hairpin bend, or a loopback. As shown, the bending area 104 may comprise, form, and/or define a dimension 104A. In some examples, the dimension 104A may be approxi-mately (e.g., to within a ±10% tolerance or another number) equal to 1 mm, 1.5 mm, 2 mm, 3 mm, or any other number.

As shown in the depicted example, the bending area 104 may comprise a single group of wires (and/or a single trace group or area, as will be described in further detail below in connection with at least FIG. 4).

Figure 5:
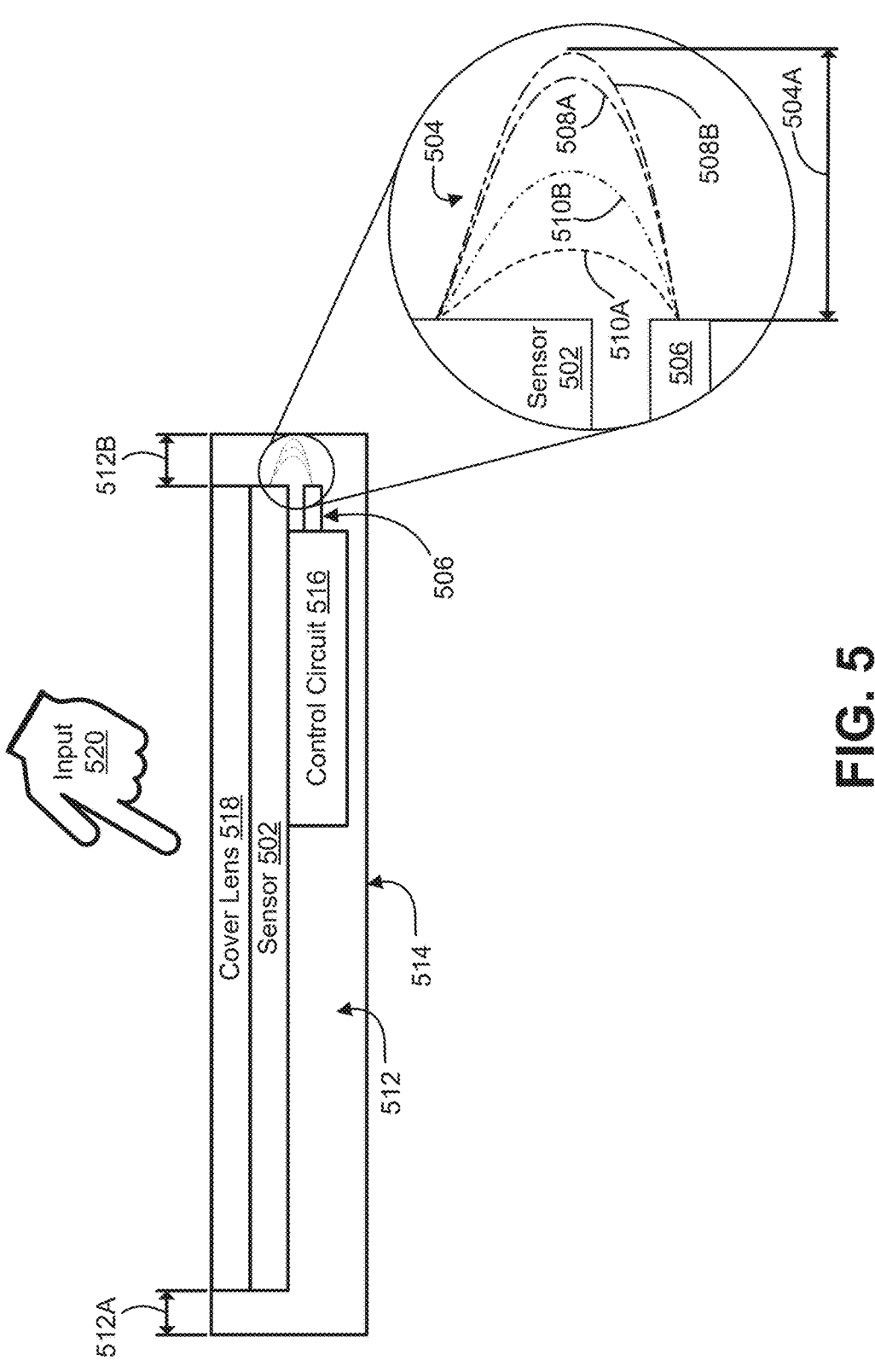
FIG. 5 illustrates a side view of an example sensor circuit disposed in an electronic device, in accordance with various aspects of the present disclosure.

In the depicted example, the bending area 104 (e.g., comprising bent portions of wire(s) 108A, wire(s) 108B, wire(s) 110A, and wire(s) 110B) is illustrated as approxi-mately half (e.g., 50% to within a ±10% tolerance or another number) within the space 112 and approximately half (e.g., 50% to within a ±10% tolerance or another number) outside of the space 112. In addition, the sensor tail 106 is illustrated as being outside of the space 112. It should be understood that the bending area 104 (and/or the sensor tail 106) are shown in the depicted configuration for illustrative purposes and to facilitate clearer description of the examples described herein. It will be understood that the bending area 104 (and/or the sensor tail 106) may be wholly within the space 112, unless specifically stated otherwise for a given example and/or otherwise understood within the context of a given example. Additionally, it will be understood that the portion(s) of the bending area 104 (and/or the sensor tail 106) (illustrated outside of the space 112) is/are folded (or bent) (as represented by the arrow 116) and located within the space 112, at least in part, below (e.g., behind, relative to the orientation depicted in FIG. 1) or above (e.g., in front of, relative to the orientation depicted in FIG. 1) in front of the unbent portions of the plurality of wires and/or the sensor 102. In some examples, the sensor tail 106 may be (e.g., mechanically, electrically, communicatively, and/or the like) coupled to a control circuit (e.g., control circuit 516 or the like) disposed (or located), at least in part, below (or above) the sensor 102 (e.g., in a display stack of an electronic device). In some examples, the dimension 104A of the bending area 104 (e.g., when bent or folded) may be approximately half (e.g., 50% to within a ±10% tolerance or another number) of the illustrated example. In some examples, the dimension 104A of the bending area 104 (e.g., when bent or folded) may be approximately (e.g., to within a ±10% tolerance or another number) equal to 0.5 mm, 0.75 mm, 1 mm, 1.5 mm, or any other number. As shown, in some examples, the bending area 104 may be aligned (e.g., to within a ±1 mm tolerance or any other number) on center with the center (e.g., represented by center line 114) of the sensor 102. In some examples, the bent portions of wire(s) 108A, wire(s) 108B, wire(s) 110A, wire(s) 110B, and/or the like (as described herein) may be folded (or bent) around the edges of the sensor 102 (and/or a display stack) (e.g., as illustrated in FIG. 5 and described in further detail below). In some examples, the bent portions of wire(s) 108A, wire(s) 108B, wire(s) 110A, wire(s) 110B and/or the like (as described herein) may be held (or secured) by tape (e.g., Kapton tape, etc.) and/or the like (e.g., glues, adhesives, fasteners, etc.) to at least one side of the sensor 102 (and/or a display stack). It should be understood that allowing wires to float (or move) freely without being secured (e.g., by tape, glue, etc.) may cause damage to one or more components of the sensor circuit 100 (or any circuit as described herein). For example, the movement associated with free floating wires may cause mechanical fatigue within one or more wires and/or other components. Mechanical fatigue (e.g., cracking, etc.) may lead to one or more breaks in the sensor tail 106, wire(s) 108A, wire(s) 108B, wire(s) 110A, wire(s) 110B, wiring connections (e.g., solder joints, etc.), and/or the like (as described herein).

The sensor tail 106, as shown, may be any electrical connector and/or portion(s) of one or more wires (or cable ribbons) as described herein. As shown, the sensor tail 106 may comprise, at least in part, one or more of a wire (e.g., wire(s) 108A, wire(s) 108B, wire(s) 110A, and wire(s) 110B), a pin, a connector, a wire harness, a soldered connection, and/or any other electrical connection as described herein. As shown in the depicted example, a first end of the sensor tail 106 may be (e.g., mechanically, electrically, communicatively, and/or the like) coupled to one or more wires (e.g., wire(s) 108A, wire(s) 108B, wire(s) 110A, wire(s) 110B, and/or the like as described herein). In some examples, a second end of the sensor tail 106 may be (e.g., mechanically, electrically, communicatively, and/or the like) coupled to a control circuit (e.g., control circuit 516 or the like) disposed (or located) within the space 112. It will be understood that if the sensor circuit 100 is not installed in (and/or connected to) an electronic device (e.g., a tablet, an e-reader, etc.) then the sensor tail 106 may comprise an exposed (or uninsulated) portion of one or more wires (e.g., wire(s) 108A, wire(s) 108B, wire(s) 110A, and wire(s) 110B) and/or one half of a two part electrical connector (e.g., a pin, a plug, a male connector, a female connector, or the like). As shown, in some examples, the sensor tail 106 may be aligned (e.g., to within a ±1 mm tolerance or any other number) on center with the center (e.g., represented by center line 114) of the sensor 102.

The plurality of receiver wires, as shown, may be one or more of any wires, cable ribbons, and/or receiver channels as described herein. As shown, the plurality of receiver wires may comprise wire(s) 108A and wire(s) 108B. In some examples, the plurality of receiver wires may be configured to receive, carry, and/or transmit electrical signals (or commands) (e.g., from a control circuit to the sensor 102 and/or vice versa). In some examples, the plurality of receiver wires may comprise 96 (or any other number of) receiver channels (and/or wires). For example, wire(s) 108A, as shown, may comprise (or be representative of) 48 (or any other number of) left (e.g., in relation to the center line 114) receiver channels (or wires). Additionally, wire(s) 108B, as shown, may comprise (or be representative of) 48 (or any other number of) right (e.g., in relation to the center line 114) receiver channels (or wires). In such examples, the sensor 102 may comprise one or more (e.g., loop) receiver circuits.

It will be understood that the term "receiver," as used herein, may be abbreviated as "Rx" (e.g., Rx wire(s), Rx channel(s), etc.). In some examples, the sensor circuit 100 may comprise at least one Rx wire. In some examples, a respective Rx wire may comprise a first Rx wire end (e.g., mechanically, electrically, communicatively, etc.) coupled to the sensor 102. Additionally, a respective Rx wire may comprise a first Rx wire portion extending from the first Rx wire end. In some such examples, the first Rx wire portion may be adjacent, at least in part, to the bottom edge (e.g., of a display stack, of the sensor 102, and/or the like relative to the orientation depicted in FIG. 1). In some examples, a respective Rx wire may comprise a second Rx wire portion extending from the first Rx wire portion. In some such examples, the second Rx wire portion may be formed to include, at least in part, an Rx wire bent portion adjacent the bottom edge (e.g., of a display stack, of the sensor 102, and/or the like relative to the orientation depicted in FIG. 1). In some examples, a respective Rx wire may comprise a second Rx wire end extending from the second Rx wire portion. In some examples, the sensor tail 106 may be formed to include, at least in part, the second Rx wire end and the sensor tail 106 may (e.g., mechanically, electrically, communicatively, etc.) couple one or more Rx wire(s) to, for example, a printed circuit board (e.g., a flexible printed circuit, etc.) of a touch control circuit (e.g., control circuit 516 or the like).

The plurality of transmitter wires, as shown, may be one or more of any wires, cable ribbons, and/or transmitter channels as described herein. As shown, the plurality of transmitter wires may comprise wire(s) 110A and wire(s) 110B. In some examples, the plurality of transmitter wires may be configured to transmit, carry, and/or receive electrical signals (or commands) (e.g., from the sensor 102 to a control circuit and/or vice versa). In some examples, the plurality of transmitter wires may comprise 72 (or any other number of) transmitter channels (and/or wires). For example, wire(s) 110A, as shown, may comprise (or be representative of) 36 (or any other number of) left (e.g., in relation to the center line 114) transmitter channels (or wires). Additionally, wire(s) 110B, as shown, may comprise (or be representative of) 36 (or any other number of) right (e.g., in relation to the center line 114) transmitter channels (or wires). In such examples, the sensor 102 may comprise one or more transmitter circuits.

It will be understood that the term "transmitter," as used herein, may be abbreviated as "Tx" (e.g., Tx wire(s), Tx channel(s), etc.). In some examples, the sensor circuit 100 may comprise at least one Tx wire. In some examples, a respective Tx wire may comprise a first Tx wire end (e.g., mechanically, electrically, communicatively, etc.) coupled to the sensor 102. Additionally, a respective Tx wire may comprise a first Tx wire portion extending from the first Tx wire end. In some such examples, the first Tx wire portion may be adjacent at least one of the right edge or the left edge (e.g., of a display stack, of the sensor 102, and/or the like relative to the orientation depicted in FIG. 1). In some examples, a respective Tx wire may comprise a second Tx wire portion extending from the first Tx wire portion. In some such examples, the second Tx wire portion may be formed to include, at least in part, a Tx wire bent portion adjacent the bottom edge (e.g., of a display stack, of the sensor 102, and/or the like relative to the orientation depicted in FIG. 1). In some examples, a respective Tx wire may comprise a second Tx wire end extending from the second Tx wire portion. In some examples, the sensor tail 106 may be formed to include, at least in part, the second Tx wire end and the sensor tail 106 may (e.g., mechanically, electrically, communicatively, etc.) couple one or more Tx wire(s) to, for example, a printed circuit board (e.g., a flexible printed circuit, etc.) of a touch control circuit (e.g., control circuit 516 or the like). In some examples, a first bent portion of at least one Tx wire and a second bent portion of at least one Rx wire may be disposed in a bending area adjacent the bottom edge of the display stack (e.g., relative to the orientation depicted in FIG. 1).

The space 112, as shown, may represent (or comprise) one or more dimensions of (e.g., a space or cavity, at least in part, formed in and/or defined by) a housing (e.g., housing 514 as described below in connection with FIG. 5) of an electronic device as described herein. As shown, the space 112 may represent (or comprise) one or more dimensions of a cavity within a housing that can host, contain, and/or enclose, at least in part, the components of the sensor circuit 100 as described herein. As shown in the depicted example, the space 112 may comprise a plurality of bezel dimensions (or widths), such as the dimension 112A, the dimension 112B, the dimension 112C, and/or the dimension 112D.

As shown in the depicted example, (e.g., relative to the orientation depicted in FIG. 1) the dimension 112A may represent (or comprise) a top width (e.g., along and/or adjacent a top edge of the sensor 102 and/or a display stack comprising the sensor 102). For example, the dimension 112A may represent (or comprise) a top width between a top edge of the sensor 102 (and/or a display stack) and a housing (e.g., housing 514 or the like) (and/or another component) of an electronic device. In some examples, the dimension 112A may be approximately (e.g., to within a ±10% tolerance or another number) equal to 1.5 mm, 2 mm, 3 mm, or any other number. In some examples, the dimension 112A may represent a width of a top bezel along (and/or adjacent) a top edge of a screen (or display).

As shown in the depicted example, (e.g., relative to the orientation depicted in FIG. 1) the dimension 112B may represent (or comprise) a bottom width (e.g., along and/or adjacent a bottom edge of the sensor 102 and/or a display stack comprising the sensor 102). For example, the dimension 112B may represent (or comprise) a bottom width between a bottom edge of the sensor 102 (and/or a display stack) and a housing (e.g., housing 514 or the like) (and/or another component) of an electronic device. In some examples, the dimension 112B may be approximately (e.g., to within a ±10% tolerance or another number) equal to 5.3 mm, 6.7 mm, 7 mm, or any other number. In some examples, the dimension 112B may represent a width of a bottom bezel along (and/or adjacent) a bottom edge of a screen (or display).

As shown in the depicted example, (e.g., relative to the orientation depicted in FIG. 1 and/or to the center line 114) the dimension 112C may represent (or comprise) a left width (e.g., along and/or adjacent a left edge of the sensor 102 and/or a display stack comprising the sensor 102). For example, the dimension 112C may represent (or comprise) a left width between a left edge of the sensor 102 (and/or a display stack) and a housing (e.g., housing 514 or the like) (and/or another component) of an electronic device. In some examples, the dimension 112C may be approximately (e.g., to within a ±10% tolerance or another number) equal to 3.4 mm, 4 mm, 5 mm, or any other number. In some examples, the dimension 112C may represent a width of a left bezel along (and/or adjacent) a left edge of a screen (or display).

As shown in the depicted example, (e.g., relative to the orientation depicted in FIG. 1 and/or to the center line 114) the dimension 112D may represent (or comprise) a right width (e.g., along and/or adjacent a right edge of the sensor 102 and/or a display stack comprising the sensor 102). For example, the dimension 112D may represent (or comprise) a right width between a right edge of the sensor 102 (and/or a display stack) and a housing (e.g., housing 514 or the like) (and/or another component) of an electronic device. In some examples, the dimension 112D may be approximately (e.g., to within a ±10% tolerance or another number) equal to 3.4 mm, 4 mm, 5 mm, or any other number. In some examples, the dimension 112D may represent a width of a right bezel along (and/or adjacent) a right edge of a screen (or display).

Now that an example sensor circuit has been described above with reference to FIG. 1, another example sensor circuit will now be described below with reference to FIG. 2.

Figure 2:
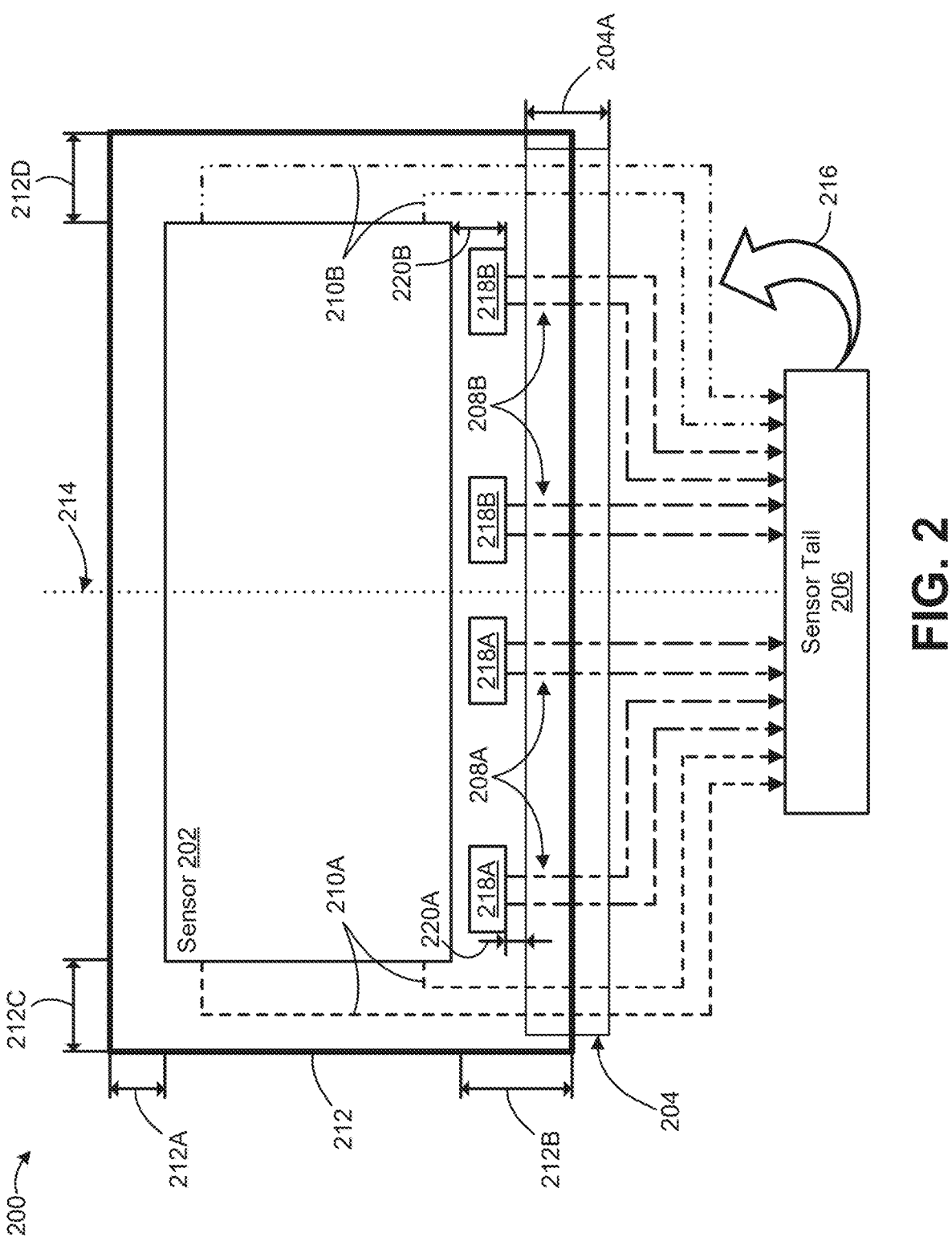
FIG. 2 illustrates an example sensor circuit, in accordance with various aspects of the present disclosure.

FIG. 2 illustrates an example sensor circuit, in accordance with various aspects of the present disclosure. As shown, the sensor circuit 200 may comprise a sensor 202, a bending area 204, a sensor tail 206, a plurality of receiver wires (e.g., wire(s) 208A, wire(s) 208B, and/or the like), a plurality of bonding pads (e.g., bonding pad(s) 218A, bonding pad(s) 218B, and/or the like), and a plurality of transmitter wires (e.g., wire(s) 210A, wire(s) 210B, and/or the like). As shown, the sensor circuit 200 may be configured to fit, at least in part, within a space 212. It will be understood that the space 212 may represent (or comprise) one or more dimensions of (e.g., a space or cavity, at least in part, formed in and/or defined by) a housing (e.g., housing 514 as described below in connection with FIG. 5) of an electronic device. In some examples, an electronic device (e.g., electronic device 500 described below in connection with FIG. 5, electronic device 600 described below in connection with FIG. 6, and/or the like) may comprise, at least in part, the sensor circuit 200. The sensor circuit 200, as shown, may comprise one or more components and/or aspects of the sensor circuit 100 as described above in connection with FIG. 1 (unless specifically stated otherwise, or otherwise understood within the context of FIG. 2).

The sensor 202, as shown, may comprise one or more components and/or aspects of the sensor 102 as described above in connection with FIG. 1 (unless specifically stated otherwise, or otherwise understood within the context of FIG. 2). As shown in the depicted example, the sensor 202 may be configured to receive (e.g., from the control circuit 516 and/or the like as described herein) electrical signals (or commands) utilizing, at least in part, one or more wires of the plurality of receiver wires (e.g., wire(s) 208A, etc.), one or more of the bonding pads of the plurality of bonding pads (e.g., bonding pad(s) 218A, etc.), and/or the sensor tail 106.

The bending area 204, as shown, may comprise one or more components and/or aspects of the bending area 104 as described above in connection with FIG. 1 (unless specifically stated otherwise, or otherwise understood within the context of FIG. 2). As shown in the depicted example, the bending area 204 may comprise a plurality of groups of wires (and/or multiple trace groups or areas, as will be described in further detail below in connection with at least FIG. 4). As shown, the plurality of receiver wires (e.g., wire(s) 208A, wire(s) 208B, and/or the like) and the plurality of transmitter wires (e.g., wire(s) 210A, wire(s) 210B, and/or the like) are routed (e.g., straight) through the bending area 204 and converge into one or more groups on the side of the bending area including the sensor tail 206 (e.g., to reduce electrical and/or signal interference that may result from bent wires). It should be appreciated that in FIG. 1, the plurality of receiver wires (e.g., wire(s) 108A, wire(s) 108B, and/or the like) and the plurality of transmitter wires (e.g., wire(s) 110A, wire(s) 110B, and/or the like) converge into one or more groups on the side of the bending area including the sensor 102 (e.g., prior to entering the bending area 104). In some examples, one or more wires (e.g., transmitter wire, receiver wire, etc.), as illustrated, may comprise a ribbon cable comprising a first wire and a second wire. In addition, the first wire and the second wire may converge, at least in part, in the bending area 104. As shown, the bending area 204 may comprise, form, and/or define a dimension 204A. In some examples, the dimension 204A may be approximately (e.g., to within a ±10% tolerance or another number) equal to 1 mm, 1.5 mm, 2 mm, 3 mm, or any other number.

In the depicted example, the bending area 204 (e.g., comprising portions of wire(s) 208A, wire(s) 208B, wire(s) 210A, and wire(s) 210B) is illustrated as approximately half (e.g., 50% to within a ±10% tolerance or another number) within the space 212 and approximately half (e.g., 50% to within a ±10% tolerance or another number) outside of the space 212. In addition, the sensor tail 206 is illustrated as being outside of the space 212. It should be understood that the bending area 204 (and/or the sensor tail 206) are shown in the depicted configuration for illustrative purposes and to facilitate clearer description of the examples described herein. It will be understood that the bending area 204

(and/or the sensor tail 206) may be wholly within the space 212, unless specifically stated otherwise for a given example and/or otherwise understood within the context of a given example. Additionally, it will be understood that the portion(s) of the bending area 204 (and/or the sensor tail 206) (illustrated outside of the space 212) is/are folded (or bent) (as represented by the arrow 216) and located within the space 212, at least in part, below (e.g., behind, relative to the orientation depicted in FIG. 2) or above (e.g., in front of, relative to the orientation depicted in FIG. 2) the unbent portions of the plurality of wires, the plurality of bonding pads, and/or the sensor 202. In some examples, the sensor tail 206 may be (e.g., mechanically, electrically, communicatively, and/or the like) coupled to a control circuit (e.g., control circuit 516 or the like) disposed (or located), at least in part, below (or above) the sensor 202 (e.g., in a display stack of an electronic device). In some examples, the dimension 204A of the bending area 204 (e.g., when bent or folded) may be approximately half (e.g., 50% to within a ±10% tolerance or another number) of the illustrated example. In some examples, the dimension 204A of the bending area 204 (e.g., when bent or folded) may be approximately (e.g., to within a ±10% tolerance or another number) equal to 0.5 mm, 0.75 mm, 1 mm, 1.5 mm, or any other number. As shown, in some examples, the bending area 204 may be aligned (e.g., to within a ±1 mm tolerance or any other number) on center with the center (e.g., represented by center line 214) of the sensor 202.

The sensor tail 206, as shown, may comprise one or more components and/or aspects of the sensor tail 106 as described above in connection with FIG. 1 (unless specifically stated otherwise, or otherwise understood within the context of FIG. 2). As shown in the depicted example, a first end of the sensor tail 206 may be (e.g., mechanically, electrically, communicatively, and/or the like) coupled to one or more wires (e.g., wire(s) 208A, wire(s) 208B, wire(s) 210A, wire(s) 210B, and/or the like as described herein). In some examples, a second end of the sensor tail 206 may be (e.g., mechanically, electrically, communicatively, and/or the like) coupled to a control circuit (e.g., control circuit 516 or the like) disposed (or located) within the space 212. It will be understood that if the sensor circuit 200 is not installed in (and/or connected to) an electronic device (e.g., a tablet, an e-reader, etc.) then the sensor tail 206 may comprise an exposed (or uninsulated) portion of one or more wires (e.g., wire(s) 208A, wire(s) 208B, wire(s) 210A, and wire(s) 210B) and/or one half of a two part electrical connector (e.g., a pin, a plug, a male connector, a female connector, or the like). As shown, in some examples, the sensor tail 206 may be aligned (e.g., to within a ±1 mm tolerance or any other number) on center with the center (e.g., represented by center line 214) of the sensor 202.

The plurality of receiver wires, as shown, may comprise one or more components and/or aspects of any receiver wires as described above in connection with FIG. 1 (unless specifically stated otherwise, or otherwise understood within the context of FIG. 2). As shown in the depicted example, the plurality of receiver wires may comprise wire(s) 208A and/or wire(s) 208B. The wire(s) 208A and the wire(s) 208B, as shown, may comprise one or more components and/or aspects of the wire(s) 108A and the wire(s) 108B, respectively, as described above in connection with FIG. 1 (unless specifically stated otherwise, or otherwise understood within the context of FIG. 2).

Figure 3:
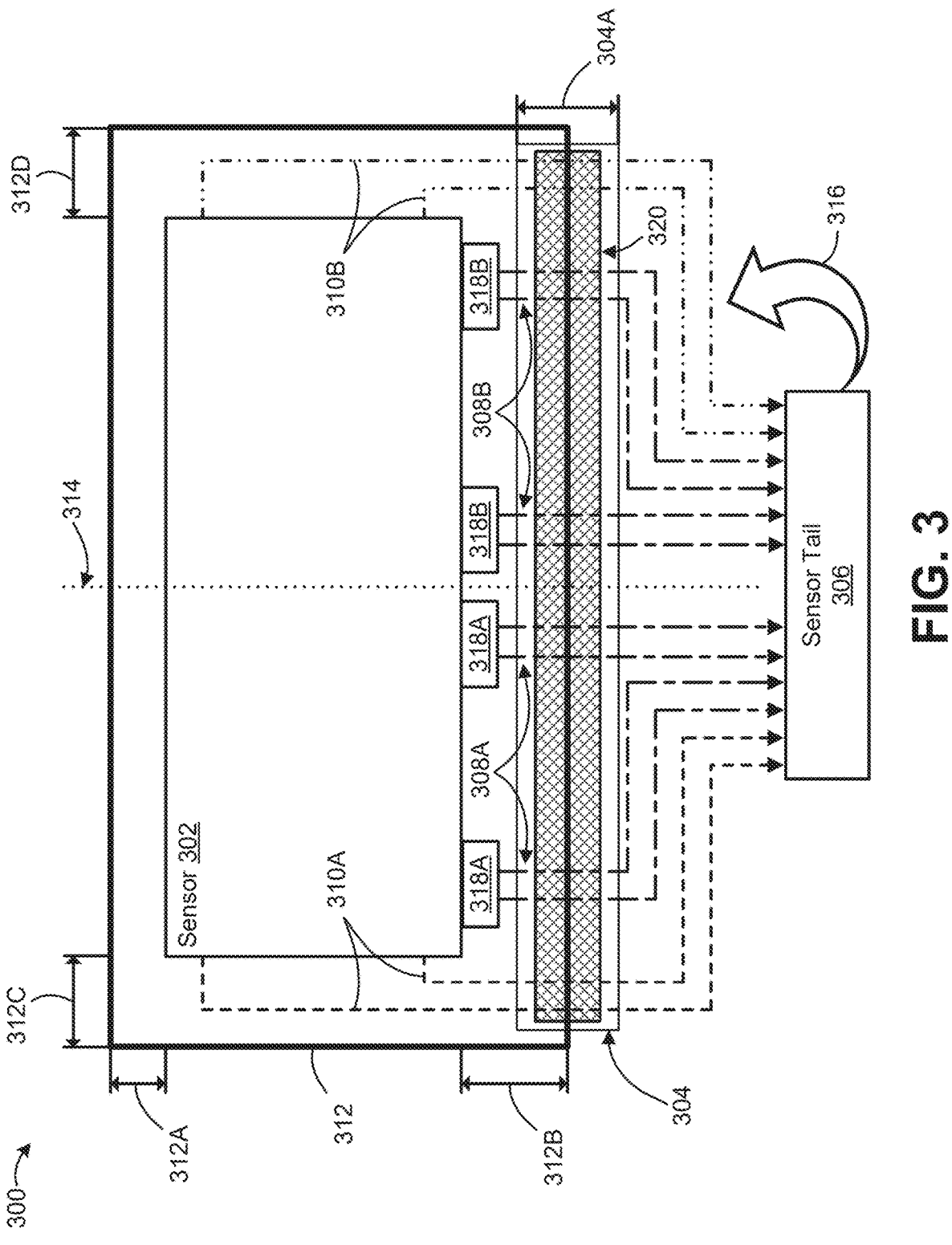
FIG. 3 illustrates an example sensor circuit, in accordance with various aspects of the present disclosure.

As shown, in some examples, the plurality of receiver wires may be coupled to a plurality of bonding pads. For instance, the wire(s) 208A may be (e.g., mechanically, electrically, communicatively, and/or the like) coupled to the bonding pad(s) 218A. Additionally, or alternatively, the wire(s) 208B may be (e.g., mechanically, electrically, communicatively, and/or the like) coupled to the bonding pad(s) 218B. As shown in the depicted example, the bonding pad(s) 218A and/or the bonding pad(s) 218B may be offset from the bending area 204, such as represented by the dimension 220A. In some examples, the dimension 220A may be approximately (e.g., to within a ±10% tolerance or another number) equal to 1.10 mm, 1.12 mm, 2 mm, or any other number. In some examples, the dimension 220A may represent, at least in part (e.g., in combination with the dimension 220B and/or the dimension 204A of the bending area 204), a width of a bottom bezel along (and/or adjacent) a bottom edge of a screen (or display). In some examples, the bonding pad(s) 218A and/or the bonding pad(s) 218B may be flush with the bending area 204. For example, the dimension 220A may be approximately (e.g., to within a ±10% tolerance or another number) equal to 0 mm. In some examples, the bonding pad(s) 218A and/or the bonding pad(s) 218B may be disposed above (e.g., in front of, relative to the orientation depicted in FIG. 2) the bending area 204. In some such examples, the wire(s) 208A and/or the wire(s) 208B may extend downward (e.g., into the page/sheet relative to the orientation depicted in FIG. 2) through the bending area 204. As shown in the depicted example, the bonding pad(s) 218A and/or the bonding pad(s) 218B may be offset from the bending area 204, such as represented by the dimension 220A. In some examples, the dimension 220B may be approximately (e.g., to within a ±10% tolerance or another number) equal to 0.75 mm, 0.78 mm, 1 mm, or any other number. In some examples, the dimension 220B may represent, at least in part (e.g., in combination with the dimension 220A and/or the dimension 204A of the bending area 204), a width of a bottom bezel along (and/or adjacent) a bottom edge of a screen (or display). For example, the dimension 212B (described below) may comprise the dimension 220A, the dimension 220B, and (e.g., approximately half) of the dimension 204A as shown. In some examples, the bonding pad(s) 218A and/or the bonding pad(s) 218B may be flush with the sensor 202 (e.g., as illustrated in FIG. 3 between the sensor 302 and the bonding pad(s) 318A and/or the bonding pad(s) 318B). For example, the dimension 220A may be approximately (e.g., to within a ±10% tolerance or another number) equal to the width (or thickness) of a respective bonding pad.

The plurality of bonding pads, as shown, may comprise the bonding pad(s) 218A, the bonding pad(s) 218B, and/or the like. In addition, the bonding pad(s) 218A and/or the bonding pad(s) 218B may be (e.g., mechanically, electrically, communicatively, and/or the like) coupled to the sensor 202 and/or to one or more respective receiver wires of the plurality of receiver wires. In some examples, at least one bonding pad may be configured to couple at least one Rx wire to the sensor 202 and the at least one bonding pad may be disposed adjacent the bottom edge (e.g., relative to the orientation depicted in FIG. 2) between the sensor 202 and a first Rx wire end (as described above in connection with FIG. 1).

The plurality of transmitter wires, as shown, may comprise one or more components and/or aspects of any transmitter wires as described above in connection with FIG. 1 (unless specifically stated otherwise, or otherwise understood within the context of FIG. 2). As shown in the depicted example, the plurality of transmitter wires may comprise wire(s) 210A and/or wire(s) 210B. The wire(s) 210A and the wire(s) 210B, as shown, may comprise one or more components and/or aspects of the wire(s) 110A and the wire(s) 110B, respectively, as described above in connection with FIG. 1 (unless specifically stated otherwise, or otherwise understood within the context of FIG. 2).

The space 212, as shown, may represent (or comprise) one or more dimensions of (e.g., a space or cavity, at least in part, formed in and/or defined by) a housing (e.g., housing 514 as described below in connection with FIG. 5) of an electronic device as described herein. As shown, the space 212 may represent (or comprise) one or more dimensions of a cavity within a housing that can host, contain, and/or enclose, at least in part, the components of the sensor circuit 200 as described herein. As shown in the depicted example, the space 212 may comprise a plurality of bezel dimensions (or widths), such as the dimension 212A, the dimension 212B, the dimension 212C, and/or the dimension 212D. The space 212, as shown, may comprise one or more components and/or aspects of the space 112 as described above in connection with FIG. 1 (unless specifically stated otherwise, or otherwise understood within the context of FIG. 2).

As shown in the depicted example, (e.g., relative to the orientation depicted in FIG. 2) the dimension 212A may represent (or comprise) a top width (e.g., along and/or adjacent a top edge of the sensor 202 and/or a display stack comprising the sensor 202). For example, the dimension 212A may represent (or comprise) a top width between a top edge of the sensor 202 (and/or a display stack) and a housing (e.g., housing 514 or the like) (and/or another component) of an electronic device. In some examples, the dimension 212A may be approximately (e.g., to within a ±10% tolerance or another number) equal to, or less than, 2 mm or any other number. In some examples, the dimension 212A may represent a width of a top bezel along (and/or adjacent) a top edge of a screen (or display). The dimension 212A, as shown, may comprise one or more components and/or aspects of the dimension 112A as described above in connection with FIG. 1 (unless specifically stated otherwise, or otherwise understood within the context of FIG. 2).

As shown in the depicted example, (e.g., relative to the orientation depicted in FIG. 2) the dimension 212B may represent (or comprise) a bottom width (e.g., along and/or adjacent a bottom edge of the sensor 202 and/or a display stack comprising the sensor 202). For example, the dimension 212B may represent (or comprise) a bottom width between a bottom edge of the sensor 202 (and/or a display stack) and a housing (e.g., housing 514 or the like) (and/or another component) of an electronic device. In some examples, the dimension 212B may be approximately (e.g., to within a ±10% tolerance or another number) equal to 3 mm, 3.4 mm, 4 mm, or any other number. In some examples, the dimension 212B may represent a width of a bottom bezel along (and/or adjacent) a bottom edge of a screen (or display). The dimension 212B, as shown, may comprise one or more components and/or aspects of the dimension 112B as described above in connection with FIG. 1 (unless specifically stated otherwise, or otherwise understood within the context of FIG. 2).

As shown in the depicted example, (e.g., relative to the orientation depicted in FIG. 2 and/or to the center line 214) the dimension 212C may represent (or comprise) a left width (e.g., along and/or adjacent a left edge of the sensor 202 and/or a display stack comprising the sensor 202). For example, the dimension 212C may represent (or comprise) a left width between a left edge of the sensor 202 (and/or a display stack) and a housing (e.g., housing 514 or the like) (and/or another component) of an electronic device. In some examples, the dimension 212C may be approximately (e.g., to within a ±10% tolerance or another number) equal to 3.4 mm, 4 mm, 5 mm, or any other number. In some examples, the dimension 212C may represent a width of a left bezel along (and/or adjacent) a left edge of a screen (or display). The dimension 212C, as shown, may comprise one or more components and/or aspects of the dimension 112C as described above in connection with FIG. 1 (unless specifically stated otherwise, or otherwise understood within the context of FIG. 2).

As shown in the depicted example, (e.g., relative to the orientation depicted in FIG. 2 and/or to the center line 114) the dimension 212D may represent (or comprise) a right width (e.g., along and/or adjacent a right edge of the sensor 202 and/or a display stack comprising the sensor 202). For example, the dimension 212D may represent (or comprise) a right width between a right edge of the sensor 202 (and/or a display stack) and a housing (e.g., housing 514 or the like) (and/or another component) of an electronic device. In some examples, the dimension 212D may be approximately (e.g., to within a ±10% tolerance or another number) equal to 3.4 mm, 4 mm, 5 mm, or any other number. In some examples, the dimension 212D may represent a width of a right bezel along (and/or adjacent) a right edge of a screen (or display). The dimension 212D, as shown, may comprise one or more components and/or aspects of the dimension 112D as described above in connection with FIG. 1 (unless specifically stated otherwise, or otherwise understood within the context of FIG. 2).

Now that example sensor circuits have been described above with reference to FIGS. 1-2, another example sensor circuit will now be described below with reference to FIG. 3.

FIG. 3 illustrates an example sensor circuit, in accordance with various aspects of the present disclosure. As shown, the sensor circuit 300 may comprise a sensor 302, a bending area 304, a sensor tail 306, a plurality of receiver wires (e.g., wire(s) 308A, wire(s) 308B, and/or the like), a plurality of bonding pads (e.g., bonding pad(s) 318A, bonding pad(s) 318B, and/or the like), a plurality of transmitter wires (e.g., wire(s) 310A, wire(s) 310B, and/or the like), and a shielding element 320. As shown, the sensor circuit 300 may be configured to fit, at least in part, within a space 312. It will be understood that the space 312 may represent (or comprise) one or more dimensions of (e.g., a space or cavity, at least in part, formed in and/or defined by) a housing (e.g., housing 514 as described below in connection with FIG. 5) of an electronic device. In some examples, an electronic device (e.g., electronic device 500 described below in connection with FIG. 5, electronic device 600 described below in connection with FIG. 6, and/or the like) may comprise, at least in part, the sensor circuit 300. The sensor circuit 300, as shown, may comprise one or more components and/or aspects of the sensor circuit 100 and/or the sensor circuit 200 as described above in connection with FIGS. 1-2 (unless specifically stated otherwise, or otherwise understood within the context of FIG. 3).

The sensor 302, as shown, may comprise one or more components and/or aspects of the sensor 102 and/or the sensor 202 as described above in connection with FIGS. 1-2 (unless specifically stated otherwise, or otherwise understood within the context of FIG. 3).

The bending area 304, as shown, may comprise one or more components and/or aspects of the bending area 104 and/or the bending area 204 as described above in connection with FIGS. 1-2 (unless specifically stated otherwise, or otherwise understood within the context of FIG. 3). As shown in the depicted example, the bending area 304 may comprise a plurality of groups of wires (and/or multiple trace groups or areas, as will be described in further detail below in connection with at least FIG. 4). As shown, the plurality of receiver wires (e.g., wire(s) 308A, wire(s) 308B, and/or the like) and the plurality of transmitter wires (e.g., wire(s) 310A, wire(s) 310B, and/or the like) are routed (e.g., straight) through the bending area 304 and converge into one or more groups on the side of the bending area including the sensor tail 306 (e.g., to reduce electrical and/or signal interference that may result from bent wires). As shown, the bending area 304 may comprise, form, and/or define a dimension 304A. In some examples, the dimension 304A may be approximately (e.g., to within a ±10% tolerance or another number) equal to 1 mm, 1.5 mm, 2 mm, 3 mm, or any other number.

In the depicted example, the bending area 304 (e.g., comprising portions of wire(s) 308A, wire(s) 308B, wire(s) 310A, and wire(s) 310B) is illustrated as approximately half (e.g., 50% to within a ±10% tolerance or another number) within the space 312 and approximately half (e.g., 50% to within a ±10% tolerance or another number) outside of the space 312. In addition, the sensor tail 306 is illustrated as being outside of the space 312. It should be understood that the bending area 304 (and/or the sensor tail 306) are shown in the depicted configuration for illustrative purposes and to facilitate clearer description of the examples described herein. It will be understood that the bending area 304 (and/or the sensor tail 306) may be wholly within the space 312, unless specifically stated otherwise for a given example and/or otherwise understood within the context of a given example. Additionally, it will be understood that the portion(s) of the bending area 304 (and/or the sensor tail 306) (illustrated outside of the space 312) is/are folded (or bent) (as represented by the arrow 316) and located within the space 312, at least in part, below (e.g., behind, relative to the orientation depicted in FIG. 3) or above (e.g., in front of, relative to the orientation depicted in FIG. 3) the unbent portions of the plurality of wires, the plurality of bonding pads, and/or the sensor 302. In some examples, the sensor tail 306 may be (e.g., mechanically, electrically, communicatively, and/or the like) coupled to a control circuit (e.g., control circuit 516 or the like) disposed (or located), at least in part, below (or above) the sensor 302 (e.g., in a display stack of an electronic device). In some examples, the dimension 304A of the bending area 304 (e.g., when bent or folded) may be approximately half (e.g., 50% to within a ±10% tolerance or another number) of the illustrated example. In some examples, the dimension 304A of the bending area 304 (e.g., when bent or folded) may be approximately (e.g., to within a ±10% tolerance or another number) equal to 0.5 mm, 0.75 mm, 1 mm, 1.5 mm, or any other number. As shown, in some examples, the bending area 304 may be aligned (e.g., to within a ±1 mm tolerance or any other number) on center with the center (e.g., represented by center line 314) of the sensor 302.

The sensor tail 306, as shown, may comprise one or more components and/or aspects of the sensor tail 106 and/or the sensor tail 206 as described above in connection with FIGS. 1-2 (unless specifically stated otherwise, or otherwise understood within the context of FIG. 3). As shown in the depicted example, a first end of the sensor tail 306 may be (e.g., mechanically, electrically, communicatively, and/or the like) coupled to one or more wires (e.g., wire(s) 308A, wire(s) 308B, wire(s) 310A, wire(s) 310B, and/or the like as described herein). In some examples, a second end of the sensor tail 306 may be (e.g., mechanically, electrically, communicatively, and/or the like) coupled to a control circuit (e.g., control circuit 516 or the like) disposed (or located) within the space 312. It will be understood that if the sensor circuit 300 is not installed in (and/or connected to) an electronic device (e.g., a tablet, an e-reader, etc.) then the sensor tail 306 may comprise an exposed (or uninsulated) portion of one or more wires (e.g., wire(s) 308A, wire(s) 308B, wire(s) 310A, and wire(s) 310B) and/or one half of a two part electrical connector (e.g., a pin, a plug, a male connector, a female connector, or the like). As shown, in some examples, the sensor tail 306 may be aligned (e.g., to within a ±1 mm tolerance or any other number) on center with the center (e.g., represented by center line 314) of the sensor 302.

The plurality of receiver wires, as shown, may comprise one or more components and/or aspects of any receiver wires as described above in connection with FIGS. 1-2 (unless specifically stated otherwise, or otherwise understood within the context of FIG. 3). As shown in the depicted example, the plurality of receiver wires may comprise wire(s) 308A and/or wire(s) 308B. As shown, in some examples, the plurality of receiver wires may be coupled to a plurality of bonding pads. For instance, the wire(s) 308A may be (e.g., mechanically, electrically, communicatively, and/or the like) coupled to the bonding pad(s) 318A. Additionally, or alternatively, the wire(s) 308B may be (e.g., mechanically, electrically, communicatively, and/or the like) coupled to the bonding pad(s) 318B. As shown in the depicted example, the bonding pad(s) 318A and/or the bonding pad(s) 318B may be flush with the sensor 302. In some examples, the bonding pad(s) 318A and/or the bonding pad(s) 318B may be offset from the sensor 302 (e.g., as described above in connection the bonding pad(s) 218A and/or the bonding pad(s) 218B shown in FIG. 2).

The plurality of bonding pads, as shown, may comprise one or more components and/or aspects of any bonding pads as described above in connection with FIG. 2 (unless specifically stated otherwise, or otherwise understood within the context of FIG. 3). The plurality of bonding pads may comprise the bonding pad(s) 318A, the bonding pad(s) 318B, and/or the like. In addition, the bonding pad(s) 318A and/or the bonding pad(s) 318B may be (e.g., mechanically, electrically, communicatively, and/or the like) coupled to the sensor 302 and/or to one or more respective receiver wires of the plurality of receiver wires.

The plurality of transmitter wires, as shown, may comprise one or more components and/or aspects of any transmitter wires as described above in connection with FIGS. 1-2 (unless specifically stated otherwise, or otherwise understood within the context of FIG. 3). As shown in the depicted example, the plurality of transmitter wires may comprise wire(s) 310A and/or wire(s) 310B.

The shielding element 320, as shown, may be any conductive and/or magnetic material as described herein for reducing (or redirecting) Electro-Magnetic Interference (EMI). For example, one or more receiver wires and/or one or more transmitter wires may, at least in part, be covered with a shielding element (e.g., shielding element 320) to preserve one or more electrical signals (or the like) from EMI. In some examples, the shielding element 320 may comprise, at least in part, one or more of a mesh ground tape, a conductive material (e.g., copper, silver, steel, etc.), a knitted wire mesh, a grounding element or electrode (e.g., a wire or other connection to a circuit's ground or a common voltage reference point in the circuit), and/or any other EMI cover as described herein. In some examples, the shielding element 320 (e.g., mesh ground tape, etc.) may be mechanically coupled (e.g., using adhesive, such as a tape with adhesive backing) to one or more wire portions (e.g., as shown in the bending area 304). For example, the bending area 304 may comprise a cable (or wire) ribbon with a single piece of mesh ground tape applied around (e.g., all sides) of the ribbon (e.g., which comprise or define the bending area 304). Additionally, or alternatively, one or more wires (e.g., a group of wires, such as a pair of the wire(s) 308A and/or the wire(s) 310A) may be wrapped with respective pieces of mesh ground tape (e.g., as described below in connection with, and depicted in, FIG. 4) to shield them from interference caused by one or more adjacent wires (e.g., the wire(s) 308B and/or the wire(s) 310B).

The space 312, as shown, may represent (or comprise) one or more dimensions of (e.g., a space or cavity, at least in part, formed in and/or defined by) a housing (e.g., housing 514 as described below in connection with FIG. 5) of an electronic device as described herein. As shown, the space 312 may represent (or comprise) one or more dimensions of a cavity within a housing that can host, contain, and/or enclose, at least in part, the components of the sensor circuit 300 as described herein. As shown in the depicted example, the space 312 may comprise a plurality of bezel dimensions (or widths), such as the dimension 312A, the dimension 312B, the dimension 312C, and/or the dimension 312D. The space 312, as shown, may comprise one or more components and/or aspects of the space 112 and/or the space 212 as described above in connection with FIGS. 1-2 (unless specifically stated otherwise, or otherwise understood within the context of FIG. 3).

As shown in the depicted example, (e.g., relative to the orientation depicted in FIG. 3) the dimension 312A may represent (or comprise) a top width (e.g., along and/or adjacent a top edge of the sensor 302 and/or a display stack comprising the sensor 302). For example, the dimension 312A may represent (or comprise) a top width between a top edge of the sensor 302 (and/or a display stack) and a housing (e.g., housing 514 or the like) (and/or another component) of an electronic device. In some examples, the dimension 312A may be approximately (e.g., to within a ±10% tolerance or another number) equal to, or less than, 2 mm or any other number. In some examples, the dimension 312A may represent a width of a top bezel along (and/or adjacent) a top edge of a screen (or display). The dimension 312A, as shown, may comprise one or more components and/or aspects of the dimension 112A and/or the dimension 212A as described above in connection with FIGS. 1-2 (unless specifically stated otherwise, or otherwise understood within the context of FIG. 3).

As shown in the depicted example, (e.g., relative to the orientation depicted in FIG. 3) the dimension 312B may represent (or comprise) a bottom width (e.g., along and/or adjacent a bottom edge of the sensor 302 and/or a display stack comprising the sensor 302). For example, the dimension 312B may represent (or comprise) a bottom width between a bottom edge of the sensor 302 (and/or a display stack) and a housing (e.g., housing 514 or the like) (and/or another component) of an electronic device. In some examples, the dimension 312B may be approximately (e.g., to within a ±10% tolerance or another number) equal to 3 mm, 3.4 mm, 4 mm, or any other number. In some examples, the dimension 312B may represent a width of a bottom bezel along (and/or adjacent) a bottom edge of a screen (or display). The dimension 312B, as shown, may comprise one or more components and/or aspects of the dimension 112B and/or the dimension 212B as described above in connection with FIGS. 1-2 (unless specifically stated otherwise, or otherwise understood within the context of FIG. 3).

As shown in the depicted example, (e.g., relative to the orientation depicted in FIG. 3 and/or to the center line 314) the dimension 312C may represent (or comprise) a left width (e.g., along and/or adjacent a left edge of the sensor 302 and/or a display stack comprising the sensor 302). For example, the dimension 312C may represent (or comprise) a left width between a left edge of the sensor 302 (and/or a display stack) and a housing (e.g., housing 514 or the like) (and/or another component) of an electronic device. In some examples, the dimension 312C may be approximately (e.g., to within a ±10% tolerance or another number) equal to 3.4 mm, 4 mm, 5 mm, or any other number. In some examples, the dimension 312C may represent a width of a left bezel along (and/or adjacent) a left edge of a screen (or display). The dimension 312C, as shown, may comprise one or more components and/or aspects of the dimension 112C and/or the dimension 212C as described above in connection with FIGS. 1-2 (unless specifically stated otherwise, or otherwise understood within the context of FIG. 3).

As shown in the depicted example, (e.g., relative to the orientation depicted in FIG. 3 and/or to the center line 114) the dimension 312D may represent (or comprise) a right width (e.g., along and/or adjacent a right edge of the sensor 302 and/or a display stack comprising the sensor 302). For example, the dimension 312D may represent (or comprise) a right width between a right edge of the sensor 302 (and/or a display stack) and a housing (e.g., housing 514 or the like) (and/or another component) of an electronic device. In some examples, the dimension 312D may be approximately (e.g., to within a ±10% tolerance or another number) equal to 3.4 mm, 4 mm, 5 mm, or any other number. In some examples, the dimension 312D may represent a width of a right bezel along (and/or adjacent) a right edge of a screen (or display). The dimension 312D, as shown, may comprise one or more components and/or aspects of the dimension 112D and/or the dimension 212D as described above in connection with FIGS. 1-2 (unless specifically stated otherwise, or otherwise understood within the context of FIG. 3).

Now that example sensor circuits have been described above with reference to FIGS. 1-3, another example sensor circuit will now be described below with reference to FIG. 4.

Figure 4:
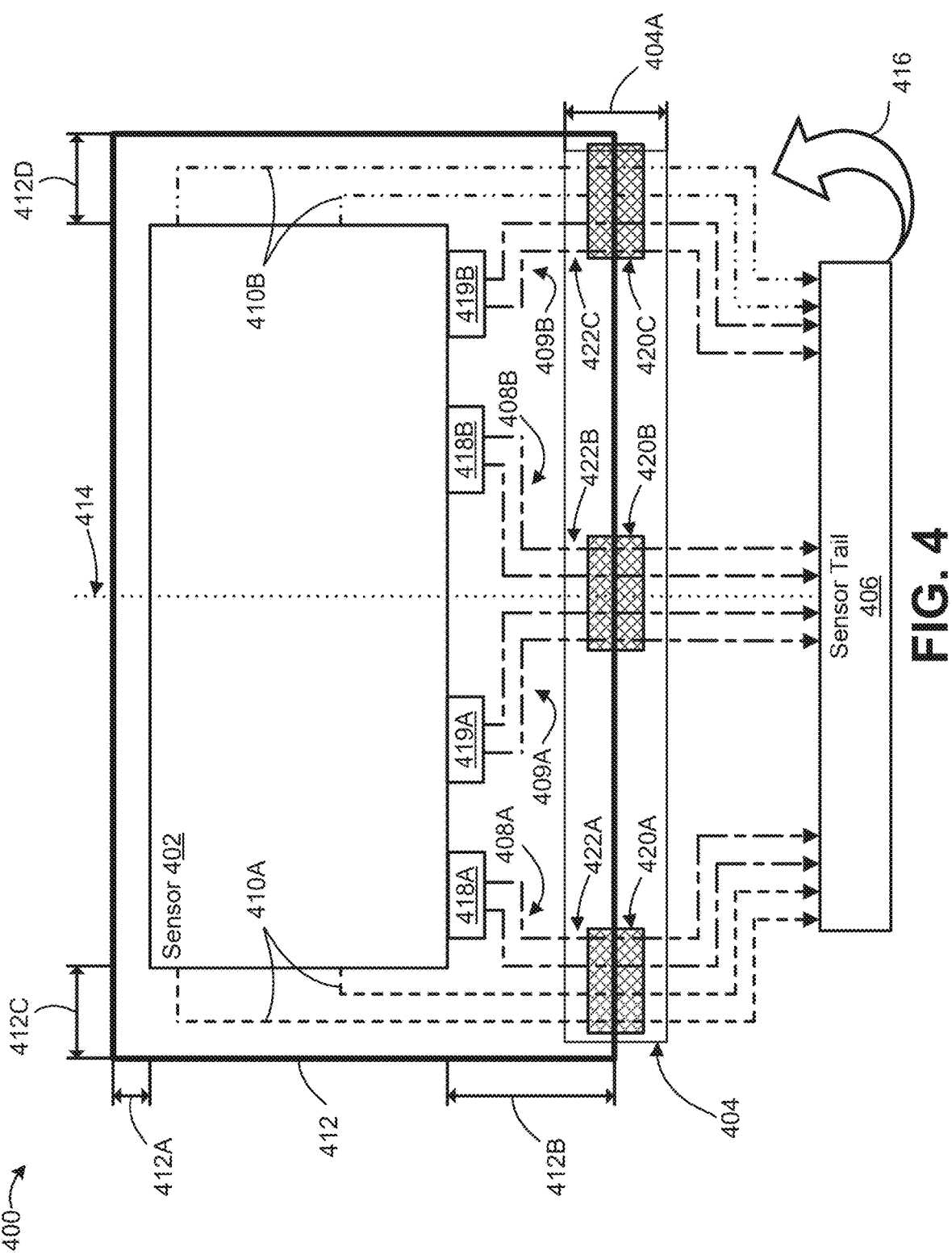
FIG. 4 illustrates an example sensor circuit, in accordance with various aspects of the present disclosure.

FIG. 4 illustrates an example sensor circuit, in accordance with various aspects of the present disclosure. As shown, the sensor circuit 400 may comprise a sensor 402, a bending area 404, a sensor tail 406, a plurality of receiver wires (e.g., wire(s) 408A, wire(s) 408B, and/or the like), a plurality of bonding pads (e.g., bonding pad(s) 418A, bonding pad(s) 418B, and/or the like), a plurality of transmitter wires (e.g., wire(s) 410A, wire(s) 410B, and/or the like), and a plurality of shielding elements (e.g., shielding element 420A, shielding element 420B, shielding element 420C, and/or the like). As shown, the sensor circuit 400 may be configured to fit, at least in part, within a space 412. It will be understood that the space 412 may represent (or comprise) one or more dimensions of (e.g., a space or cavity, at least in part, formed in and/or defined by) a housing (e.g., housing 514 as described below in connection with FIG. 5) of an electronic device. In some examples, an electronic device (e.g., electronic device 500 described below in connection with FIG. 5, electronic device 600 described below in connection with FIG. 6, and/or the like) may comprise, at least in part, the sensor circuit 400. The sensor circuit 400, as shown, may comprise one or more components and/or aspects of the sensor circuit 100, the sensor circuit 200 and/or the sensor circuit 300 as described above in connection with FIGS. 1-3

(unless specifically stated otherwise, or otherwise understood within the context of FIG. 4).

The sensor 402, as shown, may comprise one or more components and/or aspects of the sensor 102, the sensor 202, and/or the sensor 302 as described above in connection with FIGS. 1-3 (unless specifically stated otherwise, or otherwise understood within the context of FIG. 4).

The bending area 404, as shown, may comprise one or more components and/or aspects of the bending area 104, the bending area 204, and/or the bending area 304 as described above in connection with FIGS. 1-3 (unless specifically stated otherwise, or otherwise understood within the context of FIG. 4). As shown in the depicted example, the bending area 404 may comprise a plurality of groups of wires (and/or multiple trace groups or areas as described below). As shown, the plurality of receiver wires (e.g., wire(s) 408A, wire(s) 408B, and/or the like) and the plurality of transmitter wires (e.g., wire(s) 410A, wire(s) 410B, and/or the like) are routed (e.g., straight) through the bending area 404 and converge into one or more groups on the side of the bending area including the sensor tail 406 (e.g., to reduce electrical and/or signal interference that may result from bent wires). As shown, the bending area 404 may comprise, form, and/or define a dimension 404A. In some examples, the dimension 404A may be approximately (e.g., to within a ±10% tolerance or another number) equal to 1 mm, 1.5 mm, 2 mm, 3 mm, or any other number.

As shown in the depicted example, the bending area 404 (e.g., comprising portions of wire(s) 408A, wire(s) 408B, wire(s) 410A, and wire(s) 410B) is illustrated as approximately half (e.g., 50% to within a ±10% tolerance or another number) within the space 412 and approximately half (e.g., 50% to within a ±10% tolerance or another number) outside of the space 412. In addition, the sensor tail 306 is illustrated as being outside of the space 412. It should be understood that the bending area 404 (and/or the sensor tail 406) are shown in the depicted configuration for illustrative purposes and to facilitate clearer description of the examples described herein. It will be understood that the bending area 404 (and/or the sensor tail 406) may be wholly within the space 412, unless specifically stated otherwise for a given example and/or otherwise understood within the context of a given example. Additionally, it will be understood that the portion(s) of the bending area 404 (and/or the sensor tail 406) (illustrated outside of the space 412) is/are folded (or bent) (as represented by the arrow 416) and located within the space 412, at least in part, below (e.g., behind, relative to the orientation depicted in FIG. 4) or above (e.g., in front of, relative to the orientation depicted in FIG. 4) the unbent portions of the plurality of wires, the plurality of bonding pads, and/or the sensor 402. In some examples, the sensor tail 406 may be (e.g., mechanically, electrically, communicatively, and/or the like) coupled to a control circuit (e.g., control circuit 516 or the like) disposed (or located), at least in part, below (or above) the sensor 402 (e.g., in a display stack of an electronic device). In some examples, the dimension 404A of the bending area 404 (e.g., when bent or folded) may be approximately half (e.g., 50% to within a ±10% tolerance or another number) of the illustrated example. In some examples, the dimension 404A of the bending area 404 (e.g., when bent or folded) may be approximately (e.g., to within a ±10% tolerance or another number) equal to 0.5 mm, 0.75 mm, 1 mm, 1.5 mm, or any other number. As shown, in some examples, the bending area 404 may be aligned (e.g., to within a ±1 mm tolerance or any other number) on center with the center (e.g., represented by center line 414) of the sensor 402.

The sensor tail 406, as shown, may comprise one or more components and/or aspects of the sensor tail 106, the sensor tail 206, and/or the sensor tail 306 as described above in connection with FIGS. 1-3 (unless specifically stated otherwise, or otherwise understood within the context of FIG. 4). As shown in the depicted example, a first end of the sensor tail 406 may be (e.g., mechanically, electrically, communicatively, and/or the like) coupled to one or more wires (e.g., wire(s) 408A, wire(s) 408B, wire(s) 410A, wire(s) 410B, and/or the like as described herein). In some examples, a second end of the sensor tail 406 may be (e.g., mechanically, electrically, communicatively, and/or the like) coupled to a control circuit (e.g., control circuit 516 or the like) disposed (or located) within the space 412. It will be understood that if the sensor circuit 400 is not installed in (and/or connected to) an electronic device (e.g., a tablet, an e-reader, etc.) then the sensor tail 406 may comprise an exposed (or uninsulated) portion of one or more wires (e.g., wire(s) 408A, wire(s) 408B, wire(s) 410A, and wire(s) 410B) and/or one half of a two part electrical connector (e.g., a pin, a plug, a male connector, a female connector, or the like). As shown, in some examples, the sensor tail 406 may be aligned (e.g., to within a ±1 mm tolerance or any other number) on center with the center (e.g., represented by center line 414) of the sensor 402.

The plurality of receiver wires, as shown, may comprise one or more components and/or aspects of any receiver wires as described above in connection with FIGS. 1-3 (unless specifically stated otherwise, or otherwise understood within the context of FIG. 4). As shown in the depicted example, the plurality of receiver wires may comprise the wire(s) 408A, the wire(s) 409A, the wire(s) 408B, and/or the wire(s) 409B. As shown, in some examples, the plurality of receiver wires may be coupled to a plurality of bonding pads. For instance, the wire(s) 408A may be (e.g., mechanically, electrically, communicatively, and/or the like) coupled to the bonding pad(s) 418A. Additionally, or alternatively, the wire(s) 408B may be (e.g., mechanically, electrically, communicatively, and/or the like) coupled to the bonding pad(s) 418B. Additionally, or alternatively, the wire(s) 409A may be (e.g., mechanically, electrically, communicatively, and/or the like) coupled to the bonding pad(s) 419A. Additionally, or alternatively, the wire(s) 409B may be (e.g., mechanically, electrically, communicatively, and/or the like) coupled to the bonding pad(s) 419B. As shown in the depicted example, the plurality of bonding pads may be flush with the sensor 402. In some examples, the plurality of bonding pads may be offset from the sensor 402 (e.g., as described above in connection the bonding pad(s) 218A and/or the bonding pad(s) 218B shown in FIG. 2).

The plurality of bonding pads, as shown, may comprise one or more components and/or aspects of any bonding pads as described above in connection with FIGS. 2-3 (unless specifically stated otherwise, or otherwise understood within the context of FIG. 4). The plurality of bonding pads may comprise the bonding pad(s) 418A, the bonding pad(s) 419A, the bonding pad(s) 418B, the bonding pad(s) 419B, and/or the like as described herein. In addition, the bonding pad(s) 418A, the bonding pad(s) 419A, the bonding pad(s) 418B, and/or the bonding pad(s) 419B may be (e.g., mechanically, electrically, communicatively, and/or the like) coupled to the sensor 402 and/or to one or more respective receiver wires of the plurality of receiver wires.

The plurality of transmitter wires, as shown, may comprise one or more components and/or aspects of any transmitter wires as described above in connection with FIGS. 1-3 (unless specifically stated otherwise, or otherwise understood within the context of FIG. 4). As shown in the depicted example, the plurality of transmitter wires may comprise wire(s) 410A and/or wire(s) 410B.

The plurality of shielding elements, as shown, may be any conductive and/or magnetic material as described herein for reducing (or redirecting) Electro-Magnetic Interference (EMI). The plurality of shielding elements (the shielding element 420A, the shielding element 420B, and the shielding element 420C), as shown, may comprise one or more components and/or aspects of the shielding element 320 as described above in connection with FIG. 3 (unless specifically stated otherwise, or otherwise understood within the context of FIG. 4). As shown in the depicted example, the plurality of shielding elements may comprise the shielding element 420A, the shielding element 420B, and/or the shielding element 420C.

As shown, a respective shielding element of the plurality of shielding elements may be mechanically coupled (e.g., using adhesive, such as a tape with adhesive backing) to one or more portions of a wire and/or a group of wires (or trace groups). For example, as shown, a first wire (or trace) group 422A may comprise the wire(s) 410A and the wire(s) 408A. As shown in the depicted example, the first wire (or trace) group 422A may be coupled to the shielding element 420A (e.g., a piece of mesh ground tape and/or any other shielding element as described herein) in order to shield the wires of the first wire (or trace) group 422A from interference caused by one or more adjacent wires and/or any other electrical components (and/or electromagnetic phenomena). Additionally, or alternatively, a second wire (or trace) group 422B may comprise the wire(s) 409A and the wire(s) 408B. As shown in the depicted example, the second wire (or trace) group 422B may be coupled to the shielding element 420B (e.g., a piece of mesh ground tape and/or any other shielding element as described herein) in order to shield the wires of the second wire (or trace) group 422B from interference caused by one or more adjacent wires and/or any other electrical components (and/or electromagnetic phenomena). Additionally, or alternatively, a third wire (or trace) group 422C may comprise the wire(s) 409B and the wire(s) 410B. As shown in the depicted example, the third wire (or trace) group 422C may be coupled to the shielding element 420C (e.g., a piece of mesh ground tape and/or any other shielding element as described herein) in order to shield the wires of the third wire (or trace) group 422C from interference caused by one or more adjacent wires and/or any other electrical components (and/or electromagnetic phenomena).

In some examples, one or more shielding elements may be configured (or disposed), at least in part, between at least two wire (or trace) groups. For example, a mesh ground (or the like) may be positioned between the first wire (or trace) group 422A and the second wire (or trace) group 422B to prevent (or limit) EMI from the first wire (or trace) group 422A from interfering with the second wire (or trace) group 422B (or vice versa). Additionally, or alternatively, a mesh ground (or the like) may be positioned between the second wire (or trace) group 422B and the third wire (or trace) group 422C to prevent (or limit) EMI from the second wire (or trace) group 422B from interfering with the third wire (or trace) group 422C (or vice versa). In the depicted example, shown in FIG. 4, the mesh ground may be a tape (e.g., conductive copper tape, EMI tape, etc.) which may be applied to respective wire (or trace) groups. One advantage to applying tape to respective wire (or trace) groups (e.g., instead of using a single piece of tape) is that less tape is required (e.g., reducing material costs). Another advantage to applying tape to respective wire (or trace) groups (e.g., instead of using a single piece of tape) is that each wire (or trace) group may be bent (or folded) and/or secured (as described herein) independently of the other groups. In some examples, one or more shielding elements, such as the mesh ground (e.g., mesh conductive tape, EMI tape, etc.), may be applied to (e.g., on top of) the bending area 404 (and/or any other portions of wires as described herein). In some examples, one or more shielding elements (e.g., mesh ground, EMI tape, etc.) as described herein may be configured to reduce (or remove) system electrical noise (or interference), such as display noise (e.g., caused by capacitance coupling to a display device) and/or noise from any other electrical components on the system. In addition, one or more shielding elements may be configured to reduce (or remove) electrical noise (or interference) cause by a surrounding environment, such as caused by radio waves traveling through the air.

The space 412, as shown, may represent (or comprise) one or more dimensions of (e.g., a space or cavity, at least in part, formed in and/or defined by) a housing (e.g., housing 514 as described below in connection with FIG. 5) of an electronic device as described herein. As shown, the space 412 may represent (or comprise) one or more dimensions of a cavity within a housing that can host, contain, and/or enclose, at least in part, the components of the sensor circuit 400 as described herein. As shown in the depicted example, the space 412 may comprise a plurality of bezel dimensions (or widths), such as the dimension 412A, the dimension 412B, the dimension 412C, and/or the dimension 412D. The space 412, as shown, may comprise one or more components and/or aspects of the space 112, the space 212, and/or the space 312 as described above in connection with FIGS. 1-3 (unless specifically stated otherwise, or otherwise understood within the context of FIG. 4).

As shown in the depicted example, (e.g., relative to the orientation depicted in FIG. 4) the dimension 412A may represent (or comprise) a top width (e.g., along and/or adjacent a top edge of the sensor 402 and/or a display stack comprising the sensor 402). For example, the dimension 412A may represent (or comprise) a top width between a top edge of the sensor 402 (and/or a display stack) and a housing (e.g., housing 514 or the like) (and/or another component) of an electronic device. In some examples, the dimension 412A may be approximately (e.g., to within a ±10% tolerance or another number) equal to, or less than, 2 mm or any other number. In some examples, the dimension 412A may represent a width of a top bezel along (and/or adjacent) a top edge of a screen (or display). The dimension 412A, as shown, may comprise one or more components and/or aspects of the dimension 112A, the dimension 212A, and/or the dimension 312A as described above in connection with FIGS. 1-3 (unless specifically stated otherwise, or otherwise understood within the context of FIG. 4).

As shown in the depicted example, (e.g., relative to the orientation depicted in FIG. 4) the dimension 412B may represent (or comprise) a bottom width (e.g., along and/or adjacent a bottom edge of the sensor 402 and/or a display stack comprising the sensor 402). For example, the dimension 412B may represent (or comprise) a bottom width between a bottom edge of the sensor 402 (and/or a display stack) and a housing (e.g., housing 514 or the like) (and/or another component) of an electronic device. In some examples, the dimension 412B may be approximately (e.g., to within a ±10% tolerance or another number) equal to 3 mm, 3.6 mm, 4 mm, or any other number. In some examples, the dimension 412B may represent a width of a bottom bezel along (and/or adjacent) a bottom edge of a screen (or display). The dimension 412B, as shown, may comprise one or more components and/or aspects of the dimension 112B, the dimension 212B, and/or the dimension 312B as described above in connection with FIGS. 1-3 (unless specifically stated otherwise, or otherwise understood within the context of FIG. 4).

As shown in the depicted example, (e.g., relative to the orientation depicted in FIG. 4 and/or to the center line 414) the dimension 412C may represent (or comprise) a left width (e.g., along and/or adjacent a left edge of the sensor 402 and/or a display stack comprising the sensor 402). For example, the dimension 412C may represent (or comprise) a left width between a left edge of the sensor 402 (and/or a display stack) and a housing (e.g., housing 514 or the like) (and/or another component) of an electronic device. In some examples, the dimension 412C may be approximately (e.g., to within a ±10% tolerance or another number) equal to 3.4 mm, 4 mm, 5 mm, or any other number. In some examples, the dimension 412C may represent a width of a left bezel along (and/or adjacent) a left edge of a screen (or display). The dimension 412C, as shown, may comprise one or more components and/or aspects of the dimension 112C, the dimension 212C, and/or the dimension 312C as described above in connection with FIGS. 1-3 (unless specifically stated otherwise, or otherwise understood within the context of FIG. 4).

As shown in the depicted example, (e.g., relative to the orientation depicted in FIG. 4 and/or to the center line 114) the dimension 412D may represent (or comprise) a right width (e.g., along and/or adjacent a right edge of the sensor 402 and/or a display stack comprising the sensor 402). For example, the dimension 412D may represent (or comprise) a right width between a right edge of the sensor 402 (and/or a display stack) and a housing (e.g., housing 514 or the like) (and/or another component) of an electronic device. In some examples, the dimension 412D may be approximately (e.g., to within a ±10% tolerance or another number) equal to 3.4 mm, 4 mm, 5 mm, or any other number. In some examples, the dimension 412D may represent a width of a right bezel along (and/or adjacent) a right edge of a screen (or display). The dimension 412D, as shown, may comprise one or more components and/or aspects of the dimension 112D, the dimension 212D, and/or the dimension 312D as described above in connection with FIGS. 1-3 (unless specifically stated otherwise, or otherwise understood within the context of FIG. 4).

Now that example sensor circuits have been described above with reference to FIGS. 1-4, a side view of an example sensor circuit disposed in an electronic device will now be described below with reference to FIG. 5.

FIG. 5 illustrates a side view of an example sensor circuit disposed in an electronic device. As shown, the electronic device 500 may comprise, at least in part, one or more sensor circuits (e.g., sensor circuit 100, sensor circuit 200, sensor circuit 300, and/or sensor circuit 400 and/or the like) as described above in connection with FIGS. 1-4. In addition, the electronic device 500 may comprise a housing 514, a control circuit 516, and a cover lens 518. As shown in the depicted example, the sensor circuit of the electronic device 500 may comprise a sensor 502, a bending area 504, a sensor tail 506, a plurality of receiver wires (e.g., wire(s) 508A, wire(s) 508B, and/or the like), and a plurality of transmitter wires (e.g., wire(s) 510A, wire(s) 510B, and/or the like). The sensor circuit of the electronic device 500, as shown, may be configured to fit, at least in part, within a space 512 of the housing 514. The housing 514, as shown, may be formed to include (or define) the space 512 (e.g., an internal cavity within the housing 514). In some examples, the housing 514 may comprise a bezel disposed adjacent a top edge, a left edge, a right edge, and/or a bottom edge of a display stack of the electronic device 500. In some such examples, the display stack may comprise the sensor 502, the cover lens 50

The sensor 502, as shown, may comprise one or more components and/or aspects of the sensor 102, the sensor 202, the sensor 302, and/or the sensor 402 as described above in connection with FIGS. 1-4 (unless specifically stated otherwise, or otherwise understood within the context of FIG. 5). The cover lens 518, as shown, may be any transparent (or semi-transparent) protective layer as described herein for shielding the sensor 502 (e.g., from hazards of an external environment, such as dirt, dust, rocks, moisture, etc.). The cover lens 518 may comprise one or more of a scratch resistant material, an impact resistant material, an anti-glare coating, a plastic (e.g., polymer, resin, etc.), a glass, a mineral (e.g., sapphire, silica, etc.), and/or any other cover lens material described herein. In some examples, the cover lens 518 may form, or define, a portion of the housing 514. In some examples, a display stack may comprise one or more of a screen (or display), the cover lens 518, the sensor 502, and/or the like (e.g., an optically clear adhesive, the control circuit 516, etc.). As shown, a user may provide one or more inputs (e.g., the input 520 comprising touching a screen with a finger, a stylus, etc.) by pressing on the cover lens 518 (e.g., using a finger and/or a stylus, etc.) to cause the sensor 502 to generate one or more input signals (and/or command signals) which the control circuit 516 may detect, read, and/or interpret and utilize to execute (and/or cause execution, such as by a processor, of) one or more executable software instructions. The control circuit 516, as shown, may comprise any circuitry for detecting signals from the sensor 502 (and/or the like) and converting the detected signals into a format that is readable by a processor (e.g., processor(s) 602) of the electronic device 500 (or the like). For example, the control circuit 516 may comprise a touch control circuit comprising a printed circuit board (e.g., a flexible printed circuit, etc.) disposed between the display stack (e.g., comprising the cover lens 518, the sensor 502, and/or the like as described herein) and the housing 514.

The bending area 504, as shown, may comprise one or more components and/or aspects of the bending area 104, the bending area 204, the bending area 304, and/or the bending area 404 as described above in connection with FIGS. 1-4 (unless specifically stated otherwise, or otherwise understood within the context of FIG. 5). As shown in the depicted example, the bending area 504 may comprise a plurality of wires, groups of wires (or trace groups), and/or one or more ribbon cables. In the depicted example, the bending area 504 comprises a plurality of receiver wires (e.g., wire(s) 508A, wire(s) 508B, and/or the like) and a plurality of transmitter wires (e.g., wire(s) 510A, wire(s) 510B, and/or the like) that are configured to (e.g., mechanically, electrically, communicatively, etc.) couple the sensor 502 (and/or any interceding components, such as a bonding pad and/or the like) to the sensor tail 506. As shown, the bending area 504 may comprise, form, and/or define a dimension 504A. The dimension 504A, as shown, may comprise one or more components and/or aspects of the dimension 104A, the dimension 204A, the dimension 304A, and/or the dimension 404A as described above in connection with FIGS. 1-4 (unless specifically stated otherwise, or otherwise understood within the context of FIG. 5). For example, the dimension 504A may be approximately (e.g., to within a ±10% tolerance or another number) equal to 0.5 mm, 0.75 mm, 1 mm, 1.5 mm, or any other number.

In the depicted example, the plurality of receiver wires (e.g., wire(s) 508A, wire(s) 508B, and/or the like) and the plurality of transmitter wires (e.g., wire(s) 510A, wire(s) 510B, and/or the like) are illustrated with various lengths of separate wires, they are shown in the depicted configuration for illustrative purposes and to facilitate clearer description of the examples described herein. It will be understood that one or more ribbon cables (or the like) may comprise the plurality of receiver wires and the plurality of transmitter wires and that each of the wires (at least within the bending area) may be of the same (or similar, such as to within a ±10% tolerance) length. Additionally, or alternatively, the plurality of receiver wires and the plurality of transmitter wires may be configured to be parallel with each other (at least within the bending area), such as illustrated in FIGS. 1-4.

The sensor tail 506, as shown, may comprise one or more components and/or aspects of the sensor tail 106, the sensor tail 206, the sensor tail 306, and/or the sensor tail 406 as described above in connection with FIGS. 1-4 (unless specifically stated otherwise, or otherwise understood within the context of FIG. 5). As shown in the depicted example, a first end of the sensor tail 506 may be (e.g., mechanically, electrically, communicatively, and/or the like) coupled to one or more wires (e.g., wire(s) 508A, wire(s) 508B, wire(s) 510A, wire(s) 510B, and/or the like as described herein). In addition, as shown, a second end of the sensor tail 506 may be (e.g., mechanically, electrically, communicatively, and/or the like) coupled to the control circuit 516 (or the like) (e.g., disposed (or located), at least in part, below the sensor 502 within the space 512). In some examples, the sensor tail 506 may be aligned (e.g., to within a ±1 mm tolerance or any other number) on center with the center of the sensor 502 (e.g., as described above in connection with the center line 114 (and/or the like as described herein) and illustrated in FIGS. 1-4).

The plurality of receiver wires, as shown, may comprise one or more components and/or aspects of any receiver wires as described above in connection with FIGS. 1-4 (unless specifically stated otherwise, or otherwise understood within the context of FIG. 5). As shown in the depicted example, the plurality of receiver wires may comprise the wire(s) 508A, the wire(s) 508B, and/or the like. In some examples, the plurality of receiver wires may be coupled to a plurality of bonding pads (e.g., as described above in connection with, and illustrated in, FIGS. 2-4) that are (e.g., mechanically, electrically, communicatively, and/or the like) coupled to the sensor 502). For instance, the wire(s) 508A may be (e.g., mechanically, electrically, communicatively, and/or the like) coupled to a bonding pad (e.g., bonding pad(s) 218A, bonding pad(s) 318A, bonding pad(s) 418A, bonding pad(s) 419A, or the like). Additionally, or alternatively, the wire(s) 508B may be (e.g., mechanically, electrically, communicatively, and/or the like) coupled to a bonding pad (e.g., bonding pad(s) 218B, bonding pad(s) 318B, bonding pad(s) 418B, bonding pad(s) 419B, or the like). In some examples, the plurality of receiver wires may comprise one or more groups of wires (or trace groups) (e.g., as described above in connection with, and illustrated in, at least FIG. 4).

The plurality of transmitter wires, as shown, may comprise one or more components and/or aspects of any transmitter wires as described above in connection with FIGS. 1-4 (unless specifically stated otherwise, or otherwise understood within the context of FIG. 5). As shown in the depicted example, the plurality of transmitter wires may comprise wire(s) 510A and/or wire(s) 510B. In some examples, the plurality of transmitter wires may comprise one or more groups of wires (or trace groups) (e.g., as described above in connection with, and illustrated in, at least FIG. 4). In some examples, a ribbon cable may comprise one or more of the plurality of transmitter wires (or channels), the plurality of receiver wires (or channels), and/or the like as described herein. In some examples, the electronic device 500 may comprise one or more shielding elements (e.g., as described above in connection with, and illustrated in, FIGS. 3-4). In such examples, the one or more shielding elements may be any conductive and/or magnetic material as described herein for reducing (or redirecting) EMI. Additionally, or alternatively, a respective shielding element may be mechanically coupled (e.g., using adhesive, such as a tape with adhesive backing) to one or more portions of a wire, a group of wires (or trace groups), the housing 514 (e.g., a sidewall formed by housing 514 adjacent the bending area 504), and/or the like as described herein.

In some examples, at least one Tx wire (e.g., wire(s) 510A, wire(s) 510B, or the like described herein) may comprise a first Tx wire and a second Tx wire. In some examples, at least one Rx wire (e.g., wire(s) 508A, wire(s) 508B, or the like described herein) may comprise a first Rx wire and a second Rx wire. In some such examples, a first sensor trace group may comprise the first Tx wire and the first Rx wire. Additionally, a second sensor trace group may comprise the second Tx wire and the second Rx wire. In some such examples, a mesh ground (or other shielding element as described herein) may be disposed between the first sensor trace group and the second sensor trace group (e.g., to prevent, or limit, EMI between the trace groups).

The space 512, as shown, may represent (or comprise) one or more dimensions of (e.g., a space or cavity, at least in part, formed in and/or defined by) the housing 514 of the electronic device 500. As shown, the space 512 may represent (or comprise) one or more dimensions of a cavity (e.g., length, width, depth, height, etc.) defined by the internal sidewalls of the housing 514 that may be configured to host, contain, and/or enclose, at least in part, a sensor circuit (e.g., sensor circuit 100, etc.) as described herein. As shown in the depicted example, the space 512 may comprise a plurality of bezel dimensions (or widths), such as the dimension 512A, the dimension 512B, and/or the like (e.g., a left and/or a right bezel dimension as described above in connection with, and illustrated in, FIGS. 1-4). The space 512, as shown, may comprise one or more components and/or aspects of the space 112, the space 212, space 312, and/or the space 412 as described above in connection with FIGS. 1-4 (unless specifically stated otherwise, or otherwise understood within the context of FIG. 5).

As shown in the depicted example, (e.g., relative to the orientation depicted in FIG. 5) the dimension 512A may represent (or comprise) a top width (e.g., along and/or adjacent a top edge of the sensor 502 and/or a display stack comprising the sensor 502). For example, the dimension 512A may represent (or comprise) a top width between a top edge (e.g., relative to a screen of the electronic device 500) of the sensor 502 (and/or a display stack) and an internal sidewall of the housing 514. In some examples, the dimension 512A may be approximately (e.g., to within a ±10% tolerance or another number) equal to, or less than, 2 mm or any other number. In some examples, the dimension 512A may represent a width of a top bezel along (and/or adjacent) a top edge of a screen (or display). The dimension 512A, as shown, may comprise one or more components and/or aspects of the dimension 112A, the dimension 212A, the dimension 312A, and/or the dimension 412A as described above in connection with FIGS. 1-4 (unless specifically stated otherwise, or otherwise understood within the context of FIG. 5). In some examples, the cover lens 518 (or the like as described herein) may be elongated to cover the space below (e.g., relative to the orientation depicted in FIG. 5) the dimension 512A. For example, an edge portion of the cover lens may comprise, at least in part, a top bezel of the electronic device 500.

As shown in the depicted example, (e.g., relative to the orientation depicted in FIG. 5) the dimension 512B may represent (or comprise) a bottom width (e.g., along and/or adjacent a bottom edge of the sensor 502 and/or a display stack comprising the sensor 502). For example, the dimension 512B may represent (or comprise) a bottom width between a bottom edge (e.g., relative to a screen of the electronic device 500) of the sensor 502 (and/or a display stack) and an internal sidewall of the housing 514. In some examples, the dimension 512B may be approximately (e.g., to within a ±10% tolerance or another number) equal to 3.6 mm, 4 mm, 5.3 mm, 6.7 mm, or any other number. In some examples, the dimension 512B may represent a width of a bottom bezel along (and/or adjacent) a bottom edge of a screen (or display). The dimension 512B, as shown, may comprise one or more components and/or aspects of the dimension 112B, the dimension 212B, the dimension 312B, and/or the dimension 412B as described above in connection with FIGS. 1-4 (unless specifically stated otherwise, or otherwise understood within the context of FIG. 5). In some examples, the cover lens 518 (or the like as described herein) may be elongated to cover the space below (e.g., relative to the orientation depicted in FIG. 5) the dimension 512B. For example, an edge portion of the cover lens may comprise, at least in part, a bottom bezel of the electronic device 500.

Now that various example sensor circuits have been described above, a block diagram for an example electronic device will now be described below with reference to FIG. 6.

Figure 6:
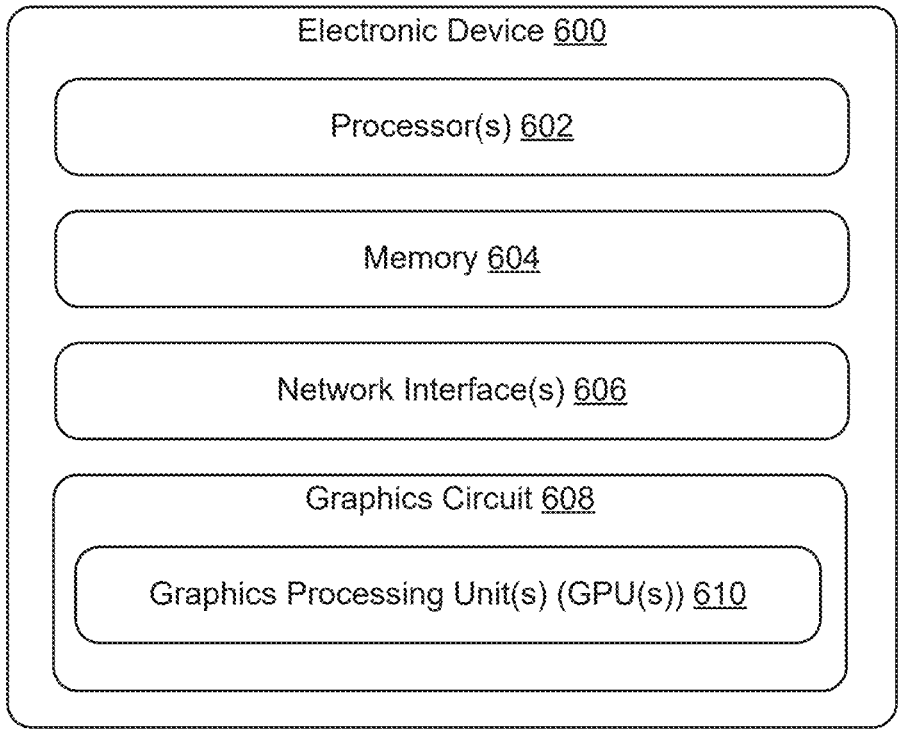
FIG. 6 illustrates a block diagram for an example electronic device, in accordance with various aspects of the present disclosure.

FIG. 6 illustrates a block diagram for an example electronic device, in accordance with various aspects of the present disclosure. Various example systems and processes described herein may include, or be implemented using, or in conjunction with, or for, a device or electronic device. Examples of the electronic device 600 may include, without limitation, a server, a desktop computer, a laptop computer, a smartphone, a wearable device (e.g., smartwatch, etc.), a tablet, an e-reader, and/or the like as described herein.

The electronic device 600, as shown, comprises at least one processor (e.g., the processor(s) 602), at least one non-transitory computer-readable memory (e.g., memory 604), network interface(s) 606, and graphics circuit 608. In some examples, the electronic device 600 may comprise a display stack (as described herein) and/or a housing comprising a bezel disposed adjacent a top edge, a left edge, a right edge, and a bottom edge of the display stack, a cover lens, a screen, and/or the like as described herein. The graphics circuit 608 (e.g., graphics chip, SoC, integrated circuit, graphics card, etc.), as shown, may comprise at least one Graphics Processing Unit (GPU), such as GPU(s) 610. In some examples, the graphics circuit 608 may further comprise dedicated memory and/or may leverage the memory 604. In some examples, the GPU(s) 610 (and/or the like) may comprise one or more features and/or aspects (e.g., multiple processors, multiple cores, cores of different types, etc.) described herein for the processor(s) 602. For example, the graphics circuit 608 may have a dedicated processor (e.g., GPU(s) 610) and/or may further leverage the processor(s) 602 (e.g., CPU(s)). The processor(s) 602 may perform various functions associated with controlling an operation of the electronic device 600, and the memory 604 may store instructions executable by the processor(s) 602 to perform any operations described herein.

As used herein, a processor or CPU, such as the processor(s) 602, may include multiple processors and/or a processor having multiple cores. Further, the processor(s) 602 may comprise one or more cores of different types. For example, the processor(s) 602 may include application processor units, graphic processing units, and so forth. In one implementation, the processor(s) 602 may comprise a microcontroller and/or a microprocessor. The processor(s) 602 may include a microprocessor, a digital signal processor or other processing units or components known in the art. Alternatively, or in addition, the functionality described herein can be performed, at least in part, by one or more hardware logic components. For example, and without limitation, illustrative types of hardware logic components that may be used include Field-Programmable Gate Arrays (FPGAs), Application-Specific Integrated Circuits (ASICs), Application-Specific Standard Products (ASSPs), System on a Chip (SoC), Complex Programmable Logic Devices (CPLDs), and/or the like. Additionally, each of the processor(s) 602 may possess its own local memory, which also may store at least one of program components, program data, program code, program instructions, firmware, software, Operating Systems (OS), and/or the like.

Memory, such as the memory 604, may include volatile and nonvolatile memory, removable and non-removable media implemented in any method or technology for storage of information, such as computer-readable instructions, data structures, program components, firmware, software, and/or any other data. The memory 604 may include, but is not limited to, one or more of Random Access Memory (RAM), Read-Only Memory (ROM), Electrically Erasable Programmable Read-Only Memory (EEPROM), flash memory or other memory technology, Digital Versatile Disks (DVD) or other optical storage, magnetic cassettes, magnetic tape, magnetic disk storage or other magnetic storage devices, Redundant Array of Independent Disks (RAID) storage systems, and/or any other medium which can be used to store the desired information and which can be accessed by a computing device.

The memory 604 may be implemented as Computer-Readable Storage Media (CRSM), which may comprise any available physical media accessible by the processor(s) 602 to execute instructions stored on the memory. In some examples, a CRSM may include RAM and flash memory (e.g., NAND flash, NOR flash, etc.). In other implementations, CRSM may include, but is not limited to, ROM, EEPROM, or any other tangible medium which can be used to store the desired information, and which can be accessed by the processor(s). The memory 604 are examples of non-transitory computer-readable media. The memory 604 may store an Operating System (OS) and one or more software applications, instructions, programs, and/or data to implement the methods described herein and the functions attributed to the various systems. For example, the memory 604 may comprise one or more databases, data tables, datasets, and/or the like as described herein. In some examples, the memory 604 may comprise one or more non-transitory computer-readable memories (or the like as described herein).

Network interface(s) 606 permit the electronic device 600 to communicate over one or more networks. For example, the network interface(s) 606 may permit the electronic device 600 to communicate over one or more communications networks (e.g., the Internet, an intranet, a mobile network, and/or the like). In some examples, a communications network may comprise one or more communications channels, tunnels, Virtual Private Networks (VPNs), and/or the like. In some examples, a communications network may be implemented using encryption techniques (e.g., end to end encryption, etc.). Example network interface(s) 606 include, without limitation, a Wi-Fi circuit (e.g., Dual-band 802.11 a/b/g/n/ac/ax 2×2 MIMO dual-antenna, Tri-band 802.11 a/b/g/n/ac/ax 2×2 MIMO dual-antenna, etc.), ZigBee circuit, Bluetooth circuit (e.g., Bluetooth 5.2, Bluetooth Low Energy (BLE), etc.), LTE circuit, 5G circuit, and/or any other communications protocol, hardware, software, and/or firmware. The network interface(s) 606 permit communication with remote device(s), such as mobile devices (e.g., phones, remote controls, microphones, etc.), systems (e.g., cloud services, remote servers, etc.), and/or the like. The network(s) may be representative of any type of communication network, including data and/or voice network, and may be implemented using wired infrastructure (e.g., cable, CAT5, fiber optic cable, etc.), a wireless infrastructure (e.g., radio frequency, cellular, microwave, satellite, Bluetooth, etc.), and/or other connection technologies.

In some instances, inbound data may be routed through the network interface(s) 606 before being directed to the processor(s) 602 and/or GPU(s) 610, and outbound data from the processor(s) 602 and/or GPU(s) 610 may be routed through the network interface(s) 606. The network interface(s) 606 may therefore receive inputs, such as data, from the processor(s) 602, the GPU(s) 610, and/or any other component described herein. For example, the network interface(s) 606 may be configured to transmit data to and/or receive data from one or more network devices (e.g., Wi-Fi routers, etc.). The network interface(s) 606 may act as a conduit for data communicated between various components and the processor(s) 602 and/or the like.

Although certain components of the electronic device 600 are illustrated, it is to be understood that the electronic device 600 may include additional and/or alternative components. For example, the electronic device 600 may include other input/output devices (e.g., haptic motors, speakers, light sources, etc.), heat dissipating elements (e.g., heatsinks, fans, vents, etc.), computing components (e.g., Printed Circuit Boards (PCBs), and/or the like. In some examples, one or more components illustrated for the electronic device 600 may be removed or omitted. In some examples, one or more components described herein may be added to or incorporated with electronic device 600. For example, the electronic device 600 may comprise, at least in part, one or more example sensor circuits as described above in connection with FIGS. 1-5.

As set forth above, certain methods, processes, operations, blocks, or components may be skipped (or omitted) in some examples. Blocks, components, or operations may be added to, or removed from, some examples. Any or all methods and processes described herein are also not limited to any particular sequence or order, and the blocks or operations relating thereto can be performed in other sequences or orders that are appropriate. For example, described blocks or operations may be performed in an order other than that specifically disclosed, or multiple blocks or operations may be combined in a single block or state. For instance, two or more blocks or operations may be executed concurrently or with partial concurrence. The example blocks or operations may be performed in serial, in parallel, or in some other manner. For example, the order of execution of two or more blocks or operations may be scrambled relative to the order described. For instance, two or more blocks or operations may be executed concurrently or with partial concurrence. In some examples, described blocks, components, or materials may be assembled in an order other than that specifically disclosed, or multiple blocks may be combined into a single block, state, or component. It is understood that all such variations are within the scope of the present disclosure.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. The various features and processes described above may be used independently of one another or may be combined in various ways. All possible combinations and sub-combinations are intended to fall within the scope of this disclosure.

In addition, conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Although this disclosure has been described in terms of certain example embodiments and applications, other embodiments and applications that are apparent to those of ordinary skill in the art, including embodiments and applications that do not provide all of the benefits described herein, are also within the scope of this disclosure. The scope of the inventions is defined only by the claims, which are intended to be construed without reference to any definitions that may be explicitly or implicitly included in any incorporated-by-reference materials.

What is claimed is:

1. An electronic device comprising:
   at least one processor;
   at least one non-transitory computer-readable memory;
   a display stack;
   a housing comprising a bezel disposed adjacent a top edge, a left edge, a right edge, and a bottom edge of the display stack; and
   a sensor circuit comprising:
      a sensor disposed within the display stack;
      a touch control circuit comprising a flexible printed circuit disposed between the display stack and the housing;
      at least one Tx wire comprising:
         a first Tx end coupled to the sensor;
         a first Tx portion extending from the first Tx end, wherein the first Tx portion is adjacent at least one of the right edge or the left edge;
         a second Tx portion extending from the first Tx portion, wherein the second Tx portion is formed to include, at least in part, a first bent portion adjacent the bottom edge; and
         a second Tx end extending from the second Tx portion;
      at least one Rx wire comprising:
         a first Rx end coupled to the sensor;
         a first Rx portion extending from the first Rx end, wherein the first Rx portion is adjacent, at least in part, the bottom edge;
         a second Rx portion extending from the first Rx portion, wherein the second Rx portion is formed to include, at least in part, a second bent portion adjacent the bottom edge; and a second Rx end extending from the second Rx portion; and a sensor tail formed to include, at least in part, the second Tx end and the second Rx end, wherein the sensor tail couples the at least one Tx wire and the at least one Rx wire to the flexible printed circuit of the touch control circuit.

2. The electronic device of claim 1, wherein the sensor circuit comprises:

at least one bonding pad configured to couple the at least one Rx wire to the sensor, wherein the at least one bonding pad is disposed adjacent the bottom edge between the sensor and the first Rx end, wherein the first bent portion of the at least one Tx wire and the second bent portion of the at least one Rx wire are disposed in a bending area adjacent the bottom edge of the display stack.

3. The electronic device of claim 1, wherein the at least one Tx wire comprises a first Tx wire and a second Tx wire, wherein the at least one Rx wire comprises a first Rx wire and a second Rx wire, wherein the sensor circuit comprises:

a first sensor trace group comprising the first Tx wire and the first Rx wire;

a second sensor trace group comprising the second Tx wire and the second Rx wire; and a mesh ground disposed between the first sensor trace group and the second sensor trace group.

4. A sensor circuit comprising:

a sensor;

a transmitter wire coupled to the sensor, wherein the transmitter wire is formed to include, at least in part, a first bent portion;

a receiver wire coupled to the sensor, wherein the receiver wire is formed to include, at least in part, a second bent portion, wherein the first bent portion and the second bent portion are formed to include, at least in part, a bending area adjacent an edge of the sensor; and a sensor tail formed to include, at least in part, the transmitter wire and the receiver wire.

5. The sensor circuit of claim 4, wherein the first bent portion comprises at least one of a 180-degree summation bend, a hairpin bend, or a loopback formed by the transmitter wire, wherein the second bent portion comprises at least one of a 180-degree summation bend, a hairpin bend, or a loopback formed by the receiver wire, wherein the first bent portion is parallel to the second bent portion, at least in part, in the bending area.

6. The sensor circuit of claim 4, comprising:

a control circuit comprising a printed circuit, wherein the sensor comprises at least one of an electromagnetic resonance panel or a touch panel, wherein the sensor tail is configured to communicatively couple the sensor to the control circuit.

7. The sensor circuit of claim 4, comprising:

a bonding pad configured to couple the sensor to the receiver wire, wherein the sensor tail is aligned on center with the sensor.

8. The sensor circuit of claim 4, wherein the transmitter wire comprises a ribbon cable comprising a first transmitter wire and a second transmitter wire, wherein the first transmitter wire and the second transmitter wire converge, at least in part, in the bending area.

9. The sensor circuit of claim 4, wherein the receiver wire comprises a ribbon cable comprising a first receiver wire and a second receiver wire, wherein the first receiver wire and the second receiver wire converge, at least in part, in the bending area.

10. The sensor circuit of claim 4, wherein the transmitter wire comprises a first transmitter wire and a second transmitter wire, wherein the receiver wire comprises a first receiver wire and a second receiver wire, wherein the sensor circuit comprises:

a first sensor trace group comprising the first transmitter wire and the first receiver wire; and a second sensor trace group comprising the second transmitter wire and the second receiver wire.

11. The sensor circuit of claim 10, comprising:

a shielding element disposed between the first sensor trace group and the second sensor trace group, wherein the shielding element comprises at least one of an electrical ground, a tape, or a wire mesh.

12. The sensor circuit of claim 11, wherein the receiver wire comprises a third receiver wire and a fourth receiver wire, wherein the sensor circuit comprises:

a third sensor trace group comprising, at least in part, the third receiver wire and the fourth receiver wire.

13. The sensor circuit of claim 12, comprising:

a second shielding element disposed between the third sensor trace group and at least one of the first sensor trace group or the second sensor trace group.

14. An electronic device comprising:

at least one processor;

at least one non-transitory computer-readable memory;

a housing comprising a bezel; and a sensor circuit comprising:

a sensor;

a transmitter wire coupled to the sensor, wherein the transmitter wire is formed to include, at least in part, a first bent portion;

a receiver wire coupled to the sensor, wherein the receiver wire is formed to include, at least in part, a second bent portion, wherein the first bent portion and the second bent portion are formed to include, at least in part, a bending area adjacent an edge of the sensor; and a sensor tail formed to include, at least in part, the transmitter wire and the receiver wire.

15. The electronic device of claim 14, wherein the first bent portion comprises at least one of a 180-degree summation bend, a hairpin bend, or a loopback formed by the transmitter wire, wherein the second bent portion comprises at least one of a 180-degree summation bend, a hairpin bend, or a loopback formed by the receiver wire, wherein the first bent portion is parallel to the second bent portion, at least in part, in the bending area.

16. The electronic device of claim 14, comprising:

a control circuit comprising a printed circuit, wherein the sensor comprises at least one of an electromagnetic resonance panel or a touch panel, wherein the sensor tail is configured to communicatively couple the sensor to the control circuit.

17. The electronic device of claim 14, comprising:

a bonding pad configured to couple the sensor to the receiver wire, wherein the sensor tail is aligned on center with the sensor.

18. The electronic device of claim 14, wherein the transmitter wire comprises a ribbon cable comprising a first transmitter wire and a second transmitter wire, wherein the first transmitter wire and the second transmitter wire converge, at least in part, in the bending area.

19. The electronic device of claim 14, wherein the receiver wire comprises a ribbon cable comprising a first receiver wire and a second receiver wire, wherein the first receiver wire and the second receiver wire converge, at least in part, in the bending area.

20. The electronic device of claim 14, wherein the transmitter wire comprises a first transmitter wire and a second transmitter wire, wherein the receiver wire comprises a first receiver wire and a second receiver wire, wherein the sensor circuit comprises:

a first sensor trace group comprising the first transmitter wire and the first receiver wire; and a second sensor trace group comprising the second transmitter wire and the second receiver wire.

* * * * *